(12) United States Patent
Sharangpani et al.

(10) Patent No.: US 9,397,046 B1
(45) Date of Patent: Jul. 19, 2016

(54) FLUORINE-FREE WORD LINES FOR THREE-DIMENSIONAL MEMORY DEVICES

(71) Applicant: SANDISK TECHNOLOGIES INC., Plano, TX (US)

(72) Inventors: Rahul Sharangpani, Fremont, CA (US); Raghuveer S. Makala, Campbell, CA (US); Sateesh Koka, Milpitas, CA (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/699,749

(22) Filed: Apr. 29, 2015

(51) Int. Cl.
| | |
|---|---|
| *H01L 29/76* | (2006.01) |
| *H01L 23/532* | (2006.01) |
| *H01L 27/115* | (2006.01) |
| *H01L 23/535* | (2006.01) |
| *H01L 21/768* | (2006.01) |

(52) U.S. Cl.
CPC .... *H01L 23/53266* (2013.01); *H01L 21/76805* (2013.01); *H01L 21/76843* (2013.01); *H01L 21/76895* (2013.01); *H01L 23/535* (2013.01); *H01L 27/1157* (2013.01); *H01L 27/11524* (2013.01); *H01L 27/11556* (2013.01); *H01L 27/11582* (2013.01)

(58) Field of Classification Search
CPC ............... H01L 23/53266; H01L 21/76805; H01L 21/76895; H01L 23/535; H01L 27/11524; H01L 27/11556; H01L 27/1157; H01L 27/0688
See application file for complete search history.

(56) References Cited

U.S. PATENT DOCUMENTS

| | | | |
|---|---|---|---|
| 5,084,417 A | 1/1992 | Joshi et al. | |
| 5,807,788 A | 9/1998 | Brodsky et al. | |
| 5,915,167 A | 6/1999 | Leedy | |
| 7,067,871 B2 * | 6/2006 | Ozawa | H01L 27/115 257/315 |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,378,353 B2 | 5/2008 | Lee et al. | |
| 7,514,321 B2 | 4/2009 | Mokhlesi et al. | |

(Continued)

FOREIGN PATENT DOCUMENTS

WO  WO02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Yosef Gebreyesus
(74) *Attorney, Agent, or Firm* — The Marbury Law Group PLLC

(57) ABSTRACT

Fluorine-induced formation of voids and electrical shorts can be avoided by forming fluorine-free metal lines. Specifically, control gate electrodes of a three-dimensional memory device can be formed employing fluorine-free deposition processes. Fluorine-free tungsten nitride can be deposited as a metallic barrier liner employing atomic layer deposition. Fluorine-free tungsten nucleation layer can be subsequently deposited. Fluorine-free tungsten fill process can be employed to form the control gate electrodes. The fluorine-free control gate electrodes do not include fluorine therein, and thus, circumvents yield and reliability issues associated with residual fluorine that are present in fluorine-containing metal lines.

23 Claims, 20 Drawing Sheets

(56) References Cited

U.S. PATENT DOCUMENTS

| | | | |
|---|---|---|---|
| 7,575,973 B2 | 8/2009 | Mokhlesi et al. | |
| 7,608,195 B2 | 10/2009 | Wilson | |
| 7,648,872 B2 | 1/2010 | Benson | |
| 7,745,265 B2 | 6/2010 | Mokhlesi et al. | |
| 7,745,312 B2 | 6/2010 | Herner et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,093,725 B2 | 1/2012 | Wilson | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,283,228 B2 | 10/2012 | Alsmeier | |
| 8,349,681 B2 | 1/2013 | Alsmeier et al. | |
| 2002/0190379 A1 | 12/2002 | Jian et al. | |
| 2006/0102586 A1 | 5/2006 | Lee et al. | |
| 2007/0210338 A1 | 9/2007 | Orlowski | |
| 2007/0252201 A1 | 11/2007 | Kito et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0012921 A1* | 1/2012 | Liu .................. | H01L 27/11565 257/326 |
| 2012/0256247 A1 | 10/2012 | Alsmeier | |
| 2013/0122712 A1 | 5/2013 | Kim et al. | |
| 2013/0224960 A1 | 8/2013 | Payyapilly et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0008714 A1 | 1/2014 | Makala et al. | |
| 2014/0353738 A1* | 12/2014 | Makala ............. | H01L 27/11551 257/321 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

U.S. Appl. No. 13/762,988, filed Feb. 8, 2013, SanDisk Technologies Inc.

U.S. Appl. No. 14/133,979, filed Dec. 19, 2013, SanDisk Technologies Inc.

U.S. Appl. No. 14/183,152, filed Feb. 18, 2014, SanDisk Technologies Inc.

U.S. Appl. No. 14/219,161, filed Mar. 19, 2014, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/264,262, filed Apr. 29, 2014, SanDisk Technologies Inc.

U.S. Appl. No. 14/264,312, filed Apr. 29, 2014, SanDisk Technologies Inc.

U.S. Appl. No. 14/264,407, filed Apr. 29, 2014, SanDisk Technologies Inc.

U.S. Appl. No. 14/282,567, filed May 20, 2014, SanDisk Technologies Inc.

U.S. Appl. No. 14/553,124, filed Nov. 25, 2014, SanDisk Technologies Inc.

U.S. Appl. No. 14/553,207, filed Nov. 25, 2014, SanDisk Technologies Inc.

U.S. Appl. No. 14/553,149, filed Nov. 25, 2014, SanDisk Technologies Inc.

\* cited by examiner

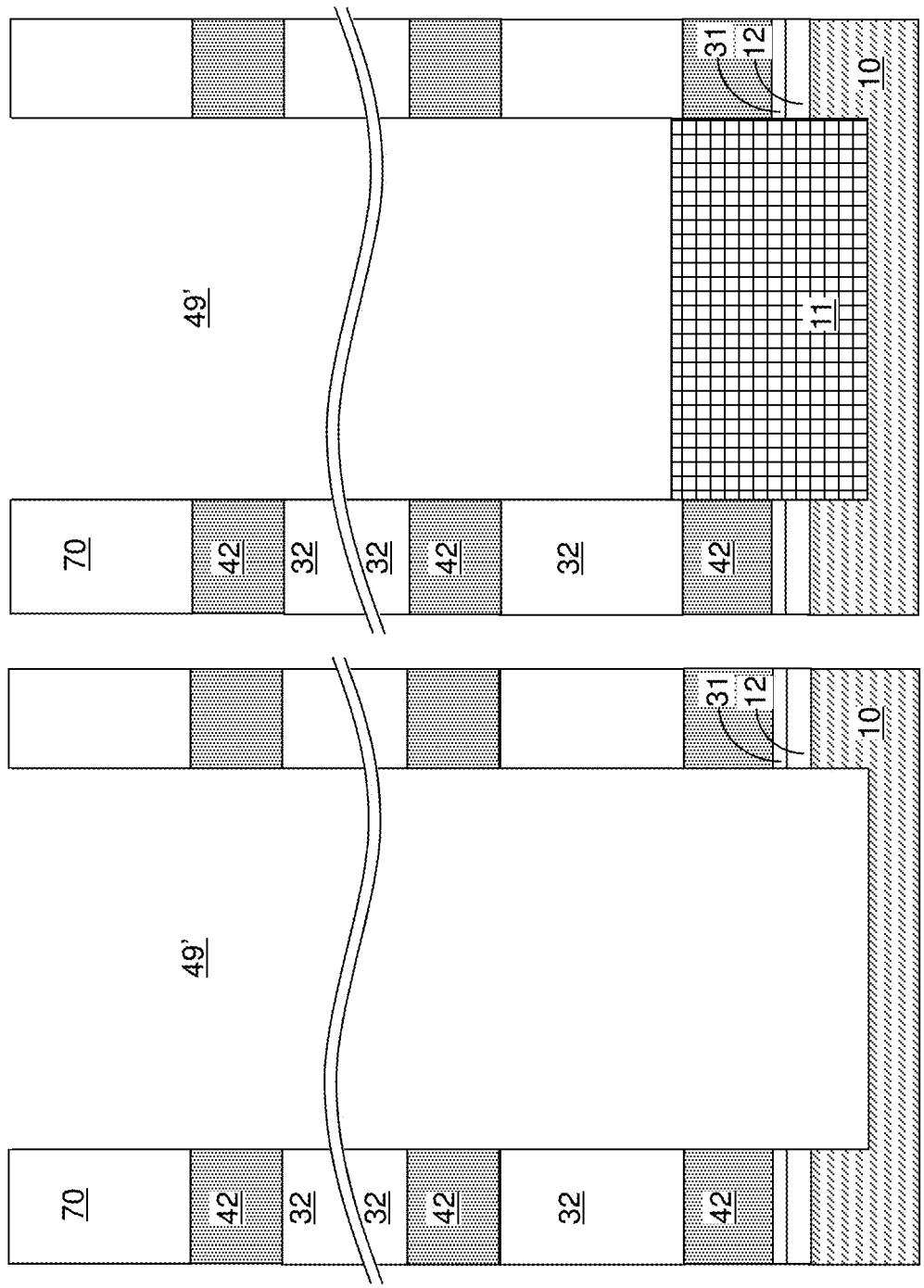

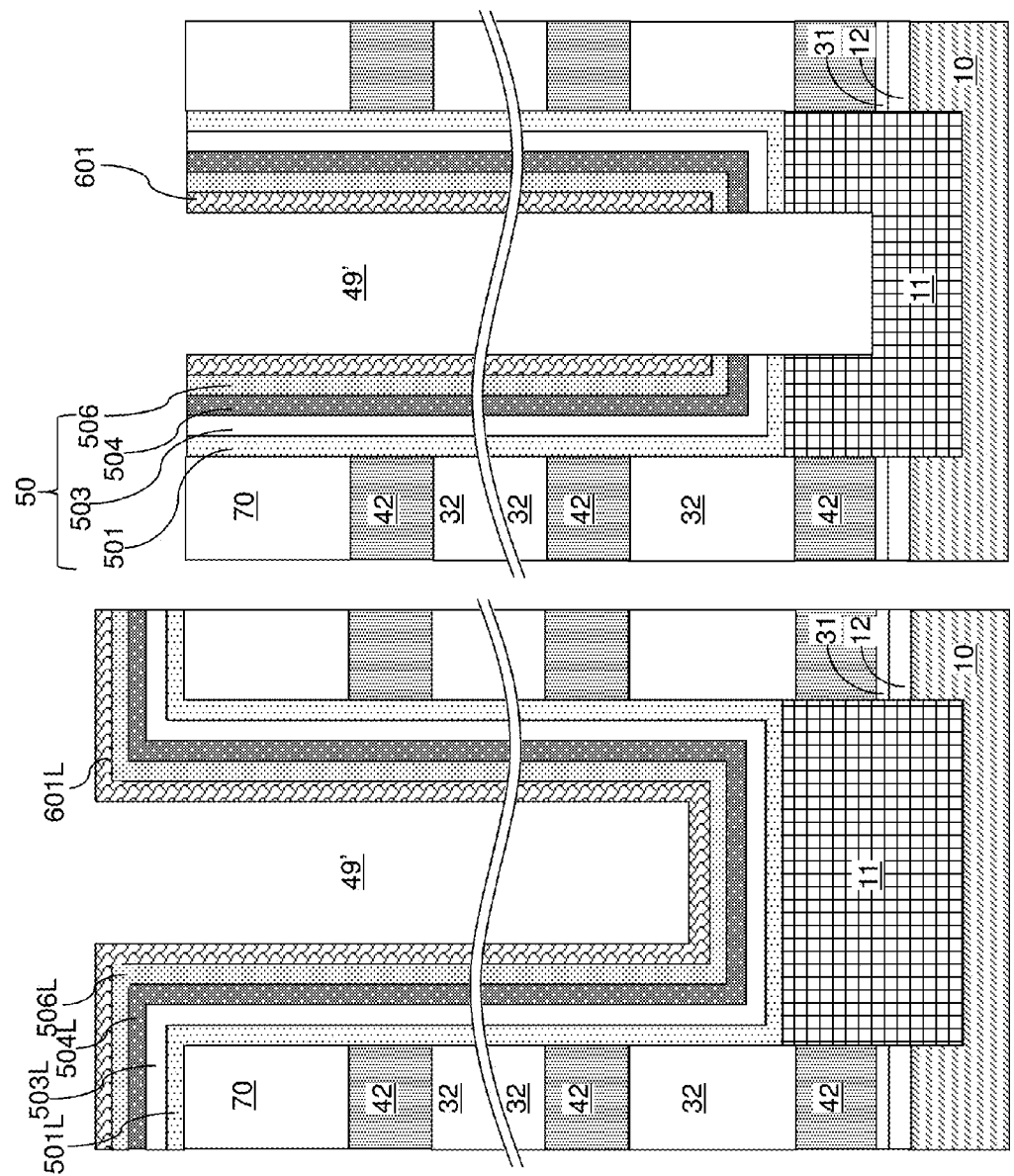

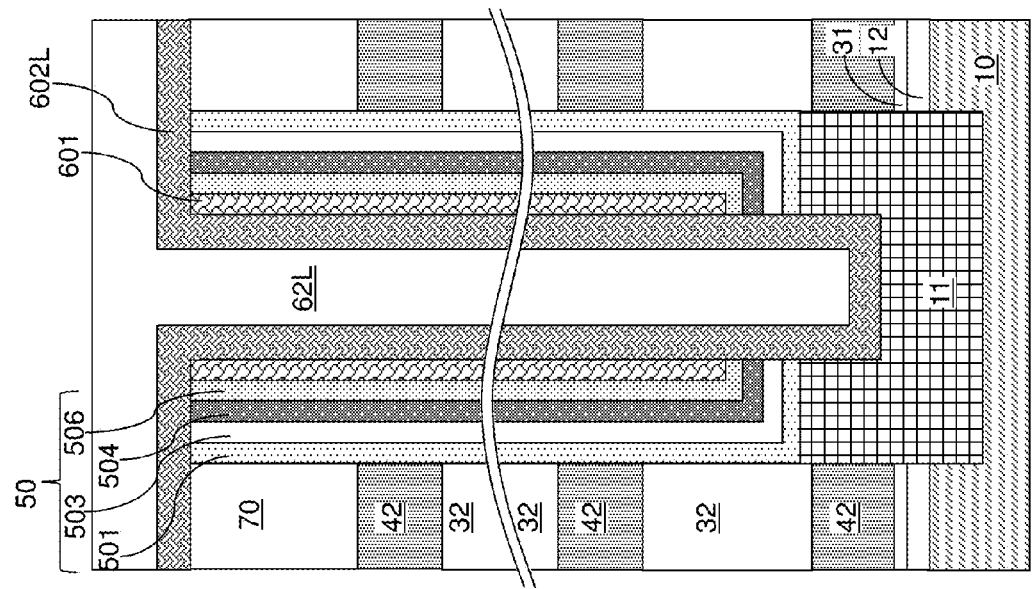
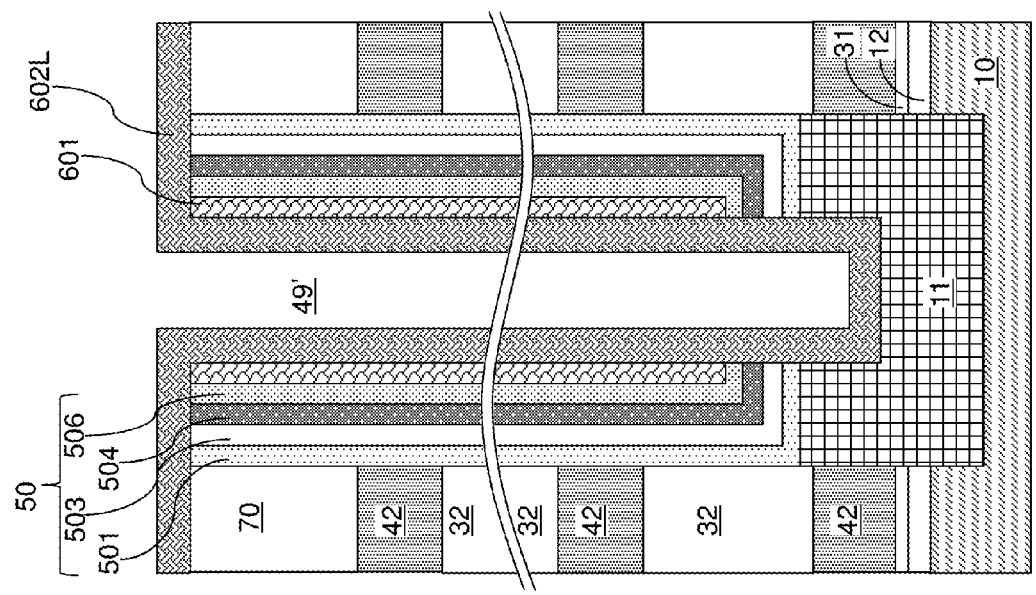

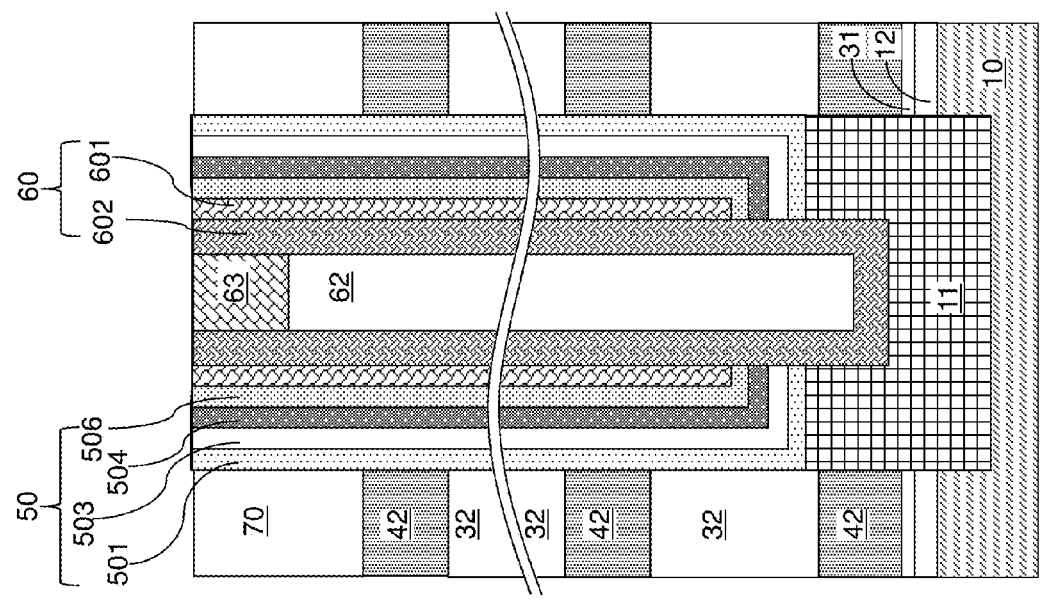
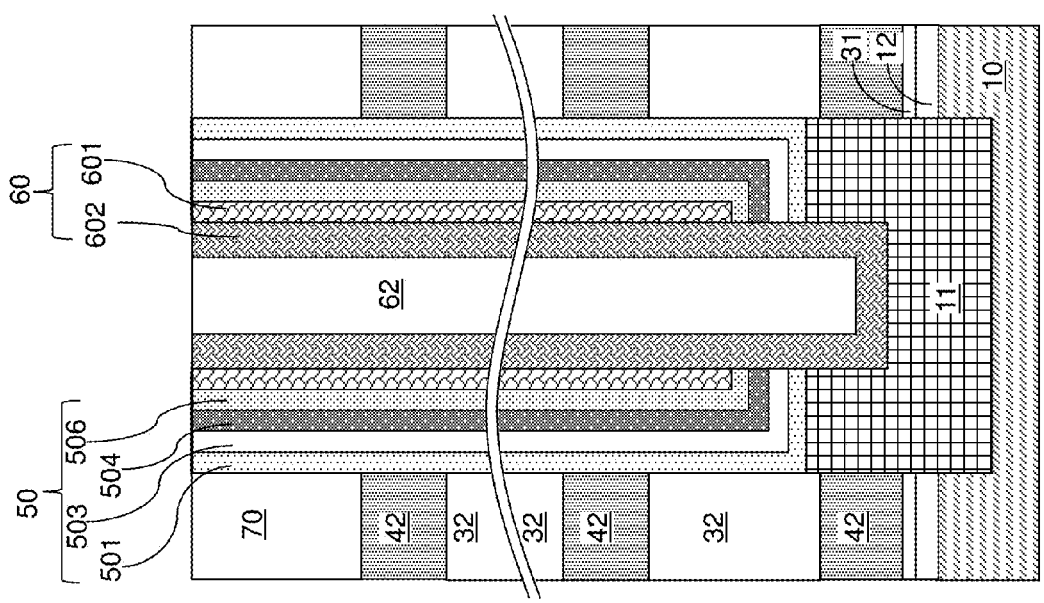

FLUORINE-FREE WORD LINES FOR THREE-DIMENSIONAL MEMORY DEVICES

FIELD

The present disclosure relates generally to the field of semiconductor devices and specifically to metal interconnect structures for providing electrical connection to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a semiconductor device is provided. A stack of alternating layers comprising insulating layers and sacrificial material layers is formed over a substrate. A plurality of memory openings is formed through the stack. Memory stack structures are formed in the plurality of memory openings. Backside recesses are formed by removing the sacrificial material layers around the memory stack structures. A refractory metal nitride layer is formed employing a fluorine-free metal nitride deposition process. A boron adsorption layer is formed on surfaces of the refractory metal nitride layer. A tungsten layer is deposited employing at least one fluorine-free tungsten deposition process. A fluorine-free electrically conductive layer fills each of the backside recesses.

According to another aspect of the present disclosure, a method of manufacturing a semiconductor device is provided. A stack of alternating layers comprising insulating layers and sacrificial material layers is formed over a substrate. A plurality of memory openings is formed through the stack. Memory stack structures are formed in the plurality of memory openings. Each of the memory stack structures comprising, from outside to inside, a memory material layer, a tunneling dielectric layer, and a semiconductor channel. A backside contact trench is formed through the stack of alternating layers. Backside recesses are formed by removing the sacrificial material layers selective to the memory stack structures employing an etchant introduced through the backside contact trench. A refractory metal nitride layer is formed in the backside recesses. A tungsten layer is deposited in remaining portions of the backside recesses. At least one of the refractory metal nitride layer and the tungsten layer is formed employing a fluorine-free deposition process employing a fluorine-free metal precursor gas in an atomic layer deposition process. Portions of the refractory metal nitride layer and tungsten layer are removed from inside the backside contact trench. Remaining portions of the tungsten layer and the refractory metal nitride layer constitute control gate electrodes for the memory stack structures.

According to another aspect of the present disclosure, a three-dimensional memory device comprises a stack of alternating layers comprising insulator layers and electrically conductive control gate layers and located over a substrate, a memory opening extending through the stack, and a memory film and a semiconductor channel located within the memory opening. Each of the electrically conductive control gate layers comprises a fluorine-free refractory metal nitride barrier layer located closest to the memory film, a nucleation layer, and a fluorine, silicon and boron free second tungsten sublayer located adjacent to the nucleation layer.

BRIEF DESCRIPTION OF THE DRAWINGS

FIGS. 2A-2H are sequential vertical cross-sectional views of a memory opening within the exemplary structure during various processing steps employed to form a memory stack structure according to an embodiment of the present disclosure.

DETAILED DESCRIPTION

Figure 1:
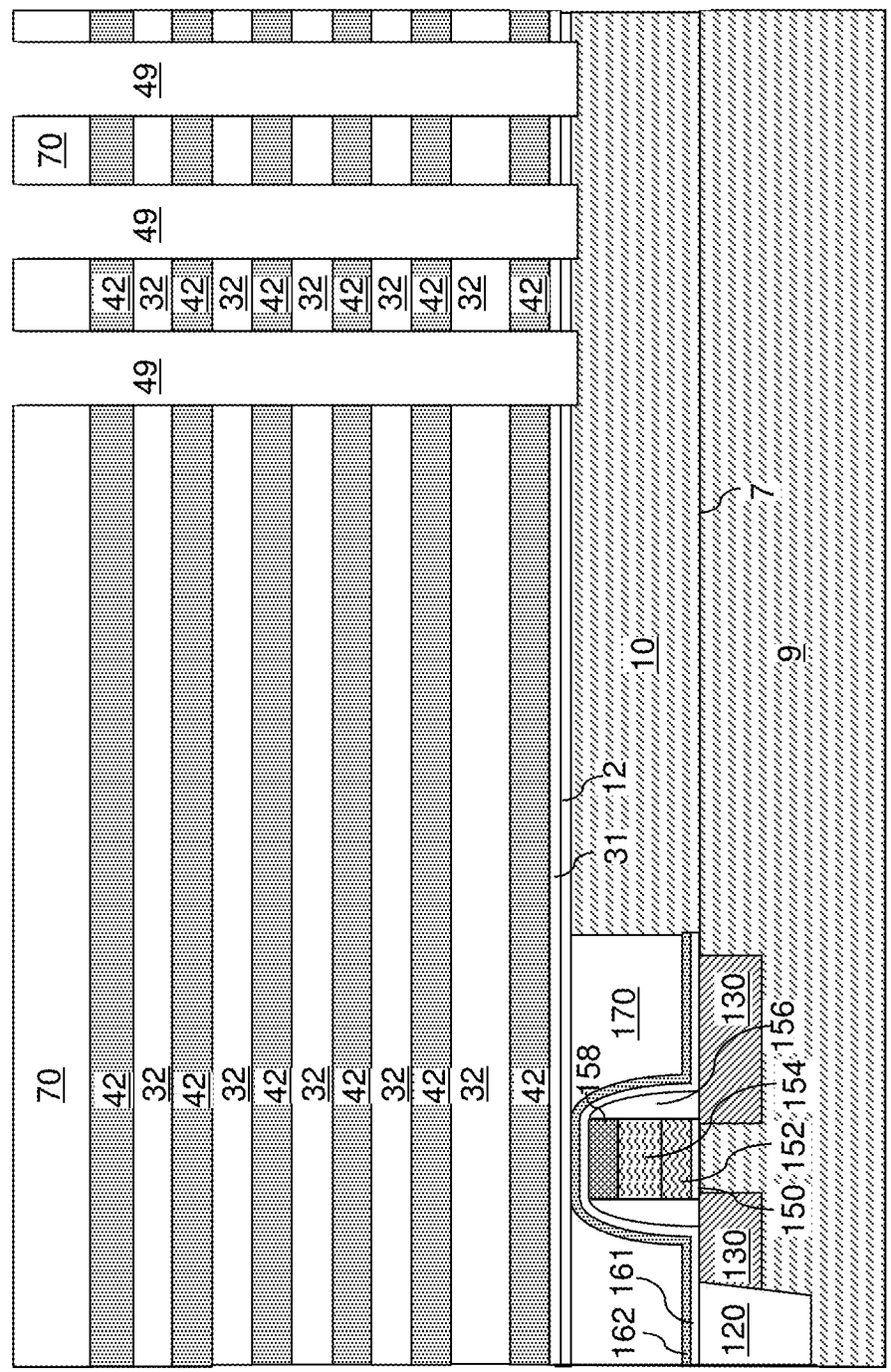
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The present inventors realized that fluorine present in metal line structures can diffuse during manufacture or operation of a semiconductor device to cause various performance and reliability issues such as fluorine-induced electrical shorts. For example, fluorine present in word lines of a three-dimensional memory device can diffuse to a dielectric material such as silicon oxide and cause voids, which can be filled with electromigrated or diffused materials to generate electrical shorts. Therefore, embodiments of the present disclosure provide at least one fluorine-free word line layer in the memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2H illustrate sequential vertical cross-sectional views of a memory opening within the exemplary structure during formation of an exemplary memory stack structure according to a embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated in a magnified view. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506I, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial channel portion 11 can be vertically recessed. A tunneling dielectric 506 is embedded within a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2H, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
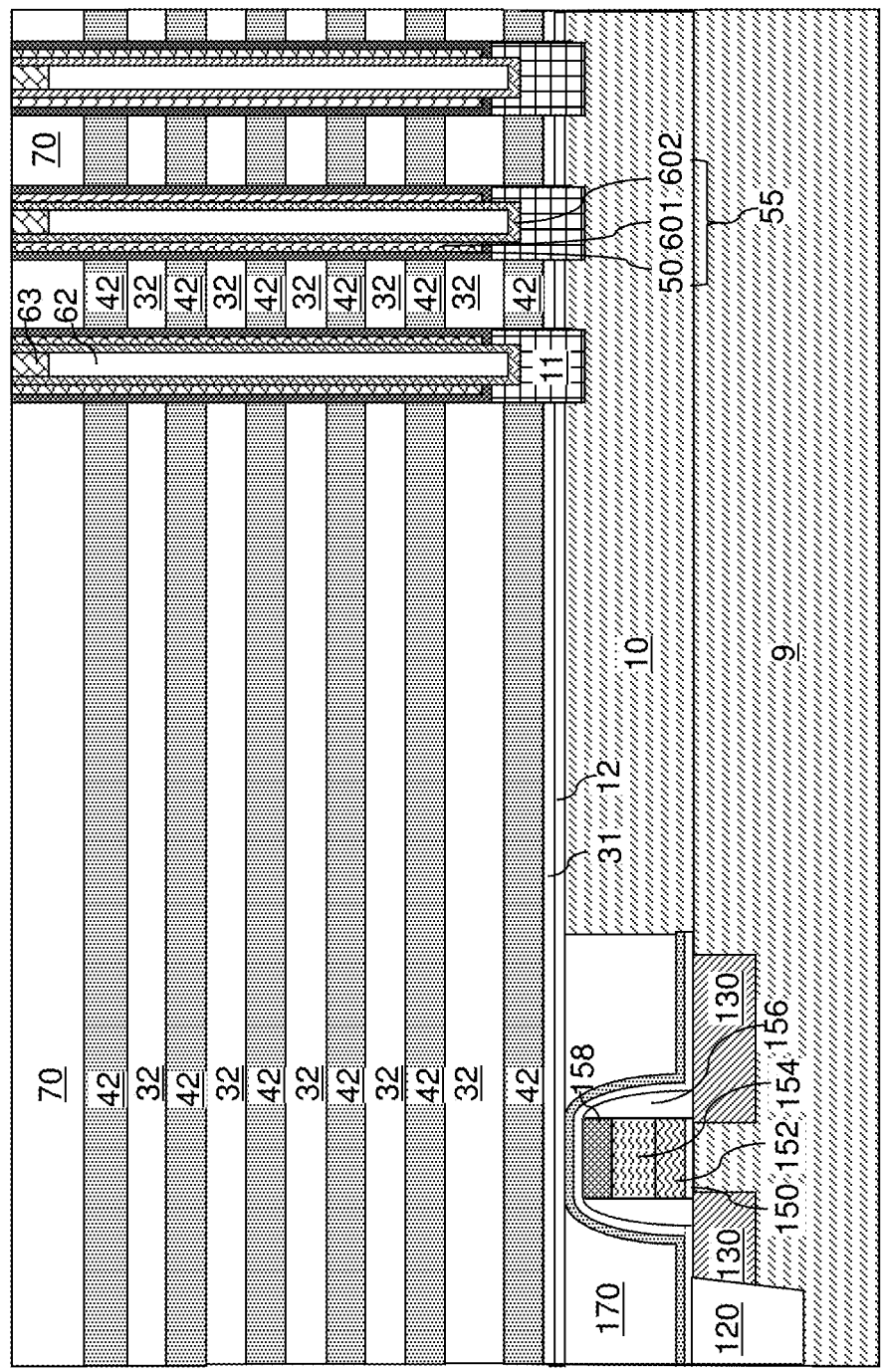
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2H. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
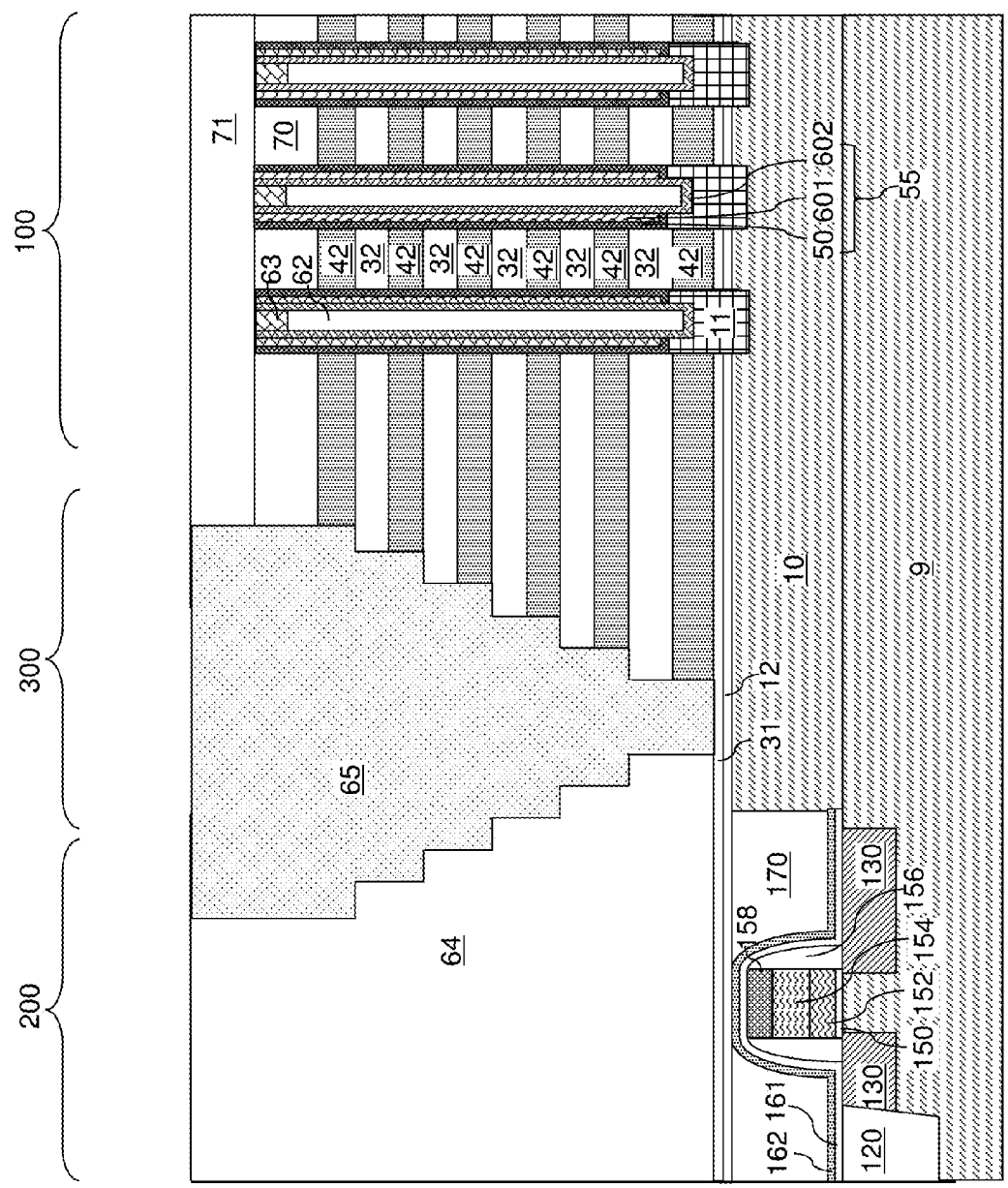
FIG. 4 is a vertical cross-sectional view of the exemplary structure after formation of a stepped terrace and a retro-stepped dielectric material portion according to an embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
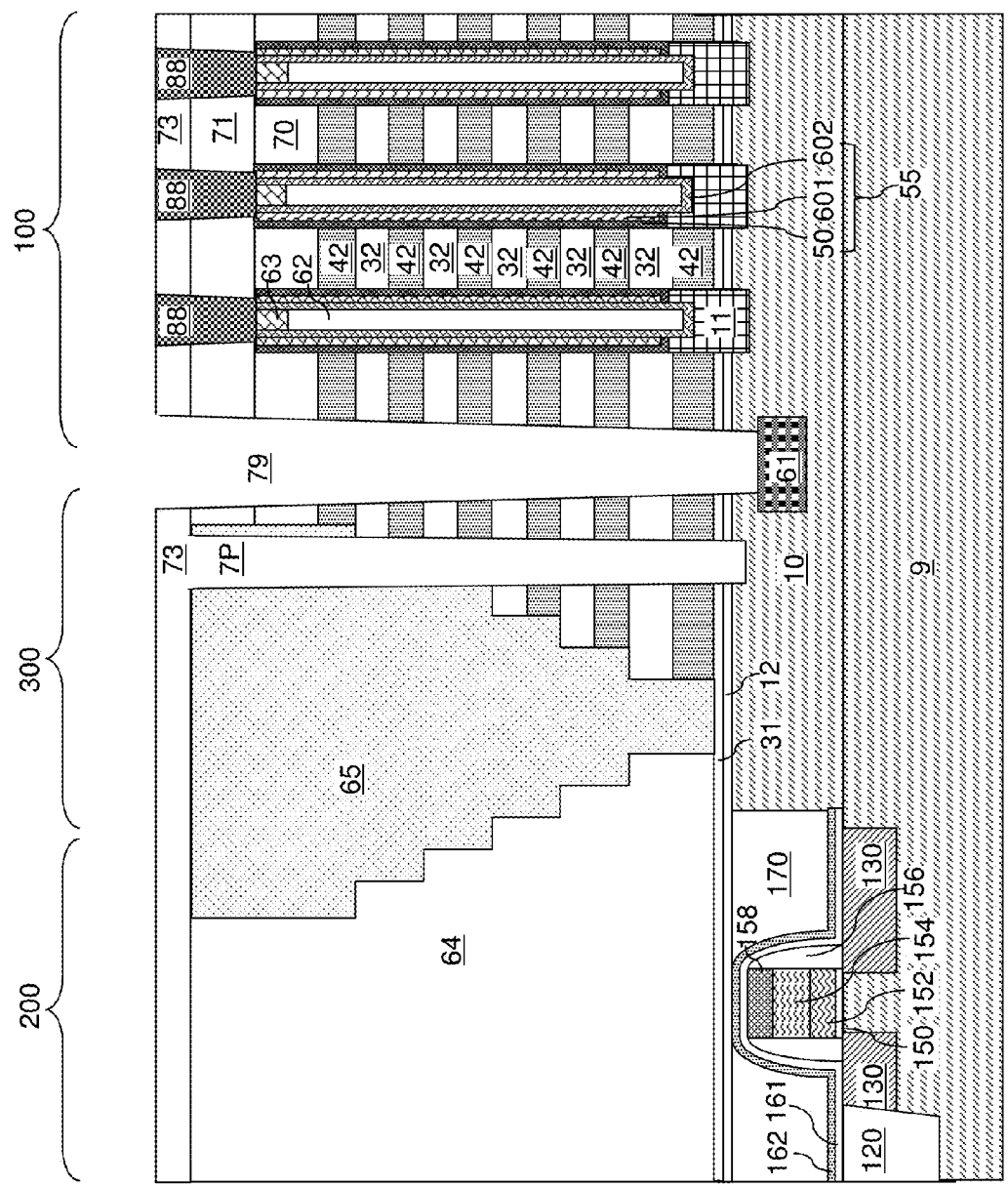
FIG. 5A is a vertical cross-sectional view of the exemplary structure after formation of a backside contact trench according to an embodiment of the present disclosure.
Figure 5B:
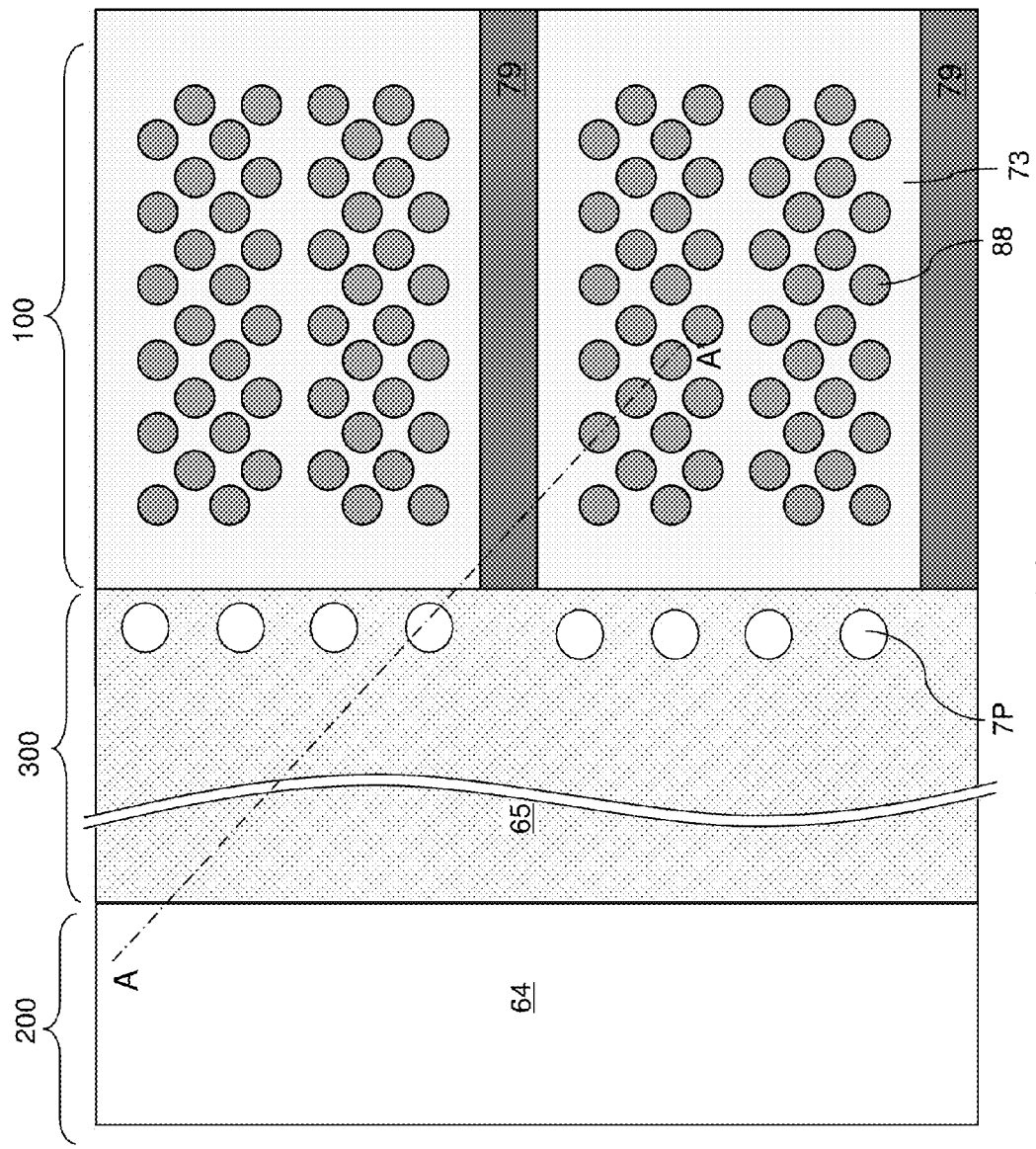
FIG. 5B is a partial see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Memory contact via structures 88 can be formed through the first and second contact level dielectric layers (73, 71). Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying drain region 63. The photoresist layer can be subsequently removed, for example, by ashing.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 6:
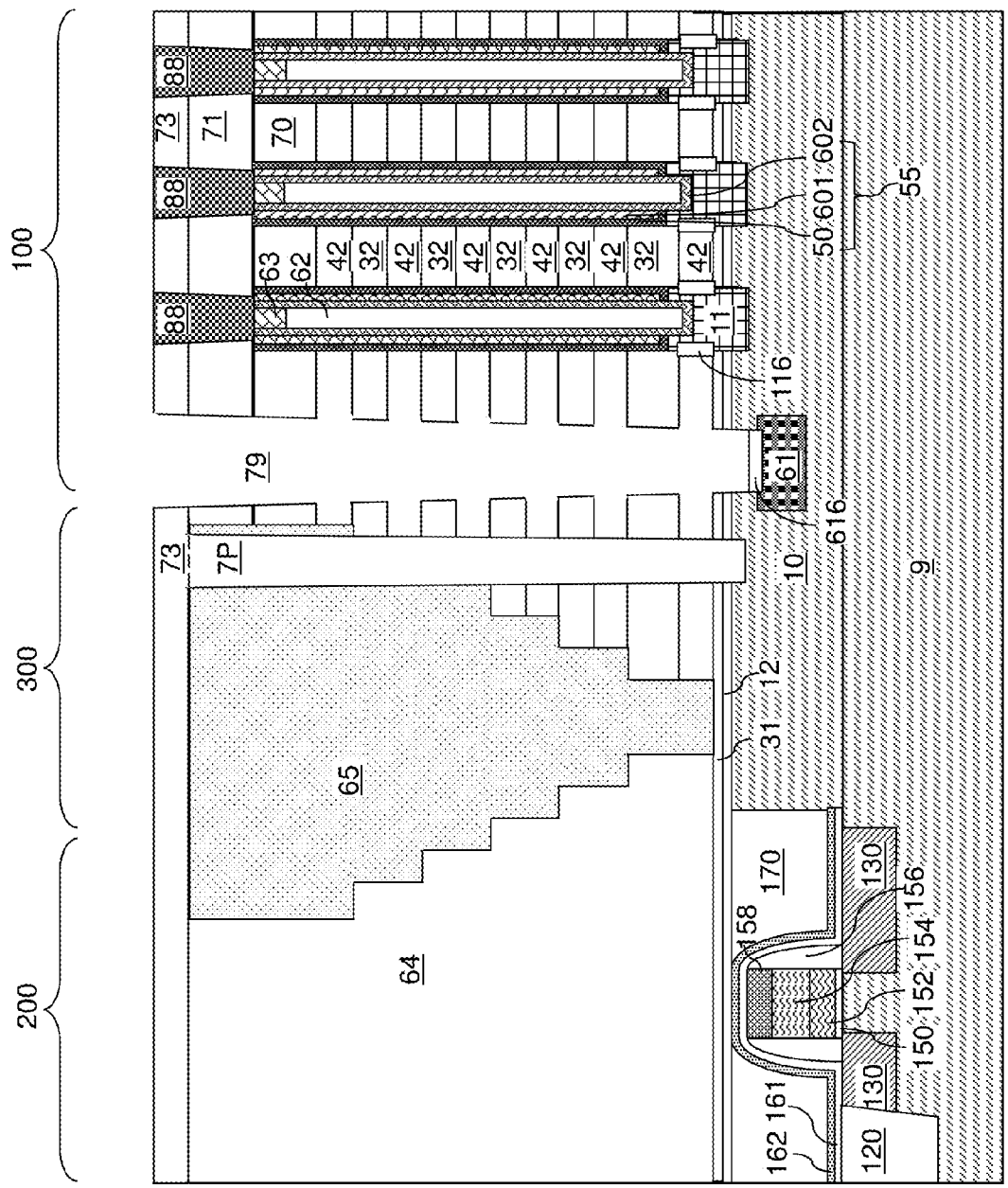
FIG. 6 is a vertical cross-sectional view of the exemplary structure after formation of backside recesses according to an embodiment of the present disclosure.

Referring to FIG. 6, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 7:
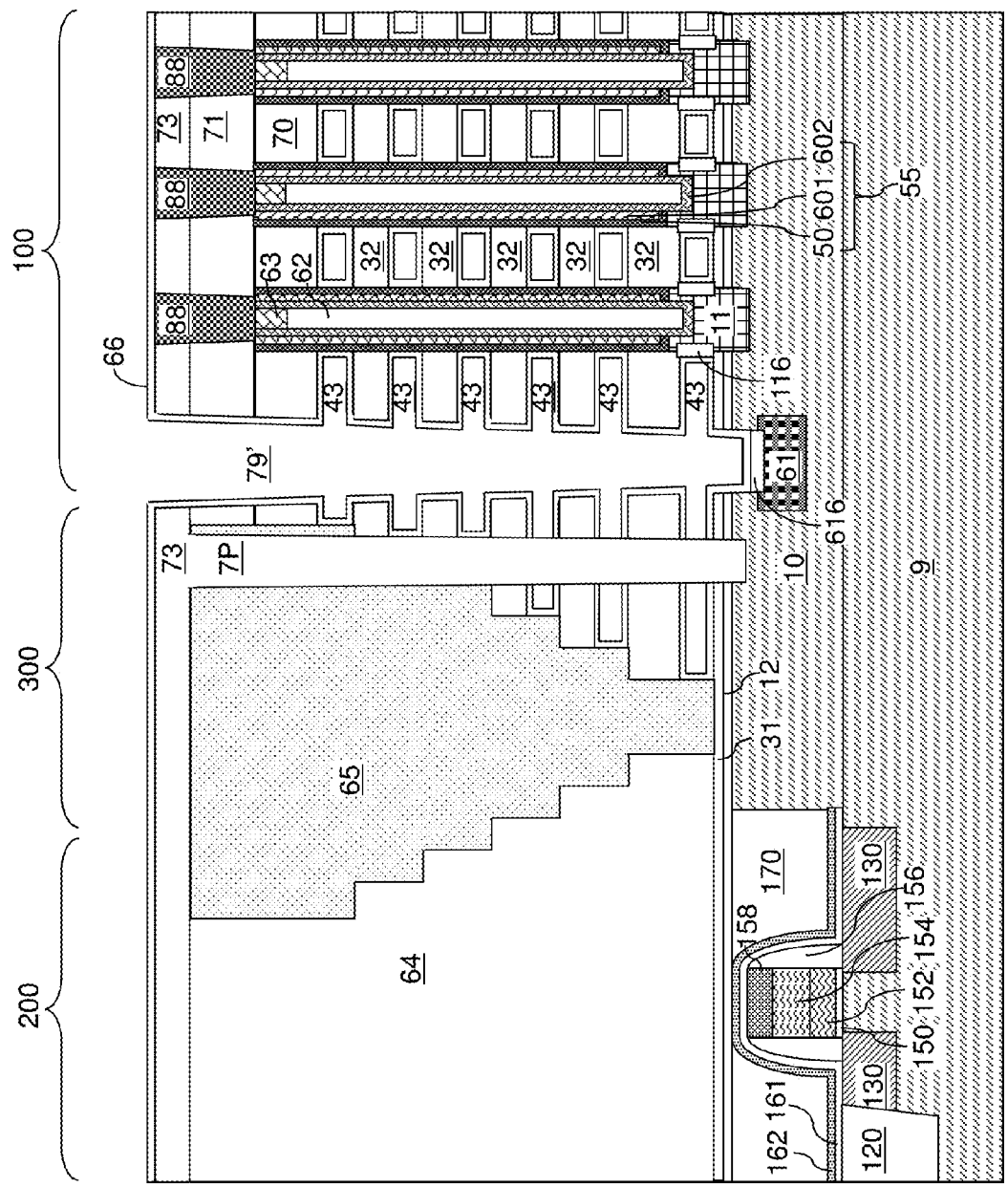
FIG. 7 is a vertical cross-sectional view of the exemplary structure after formation of a backside blocking dielectric layer according to an embodiment of the present disclosure.
Figure 8A:
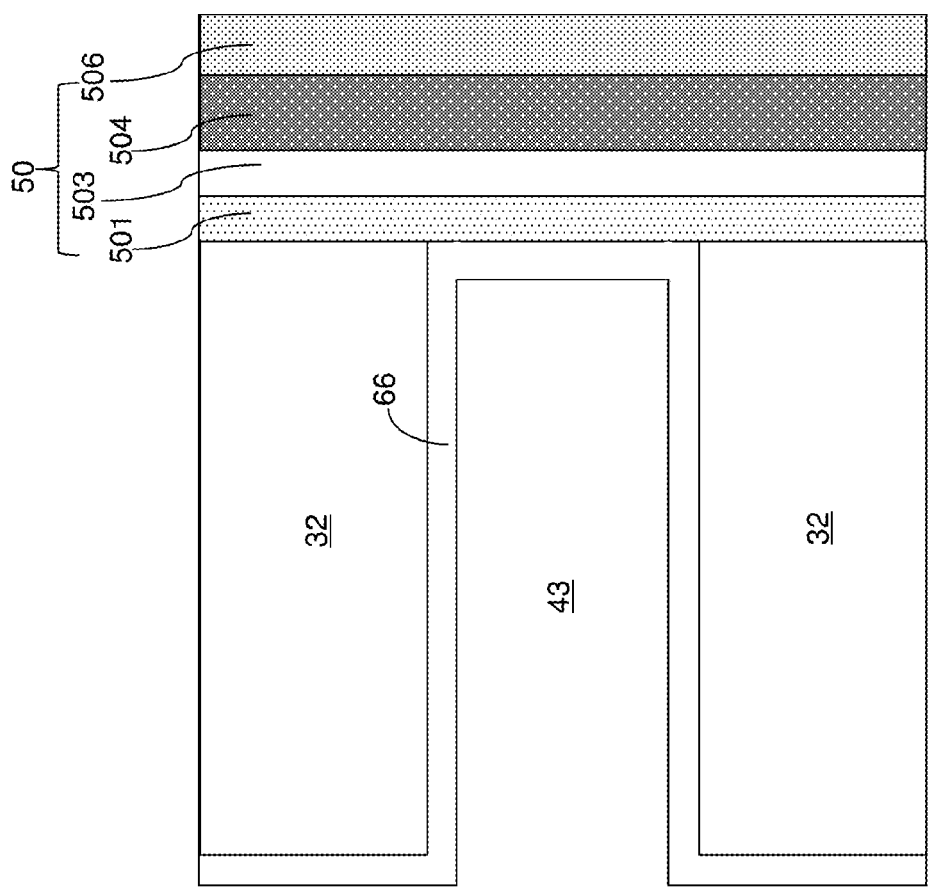
FIG. 8A is a magnified view of a backside recess region of the exemplary structure of FIG. 7.

Referring to FIGS. 7 and 8A, an optional backside blocking dielectric layer 66 can be optionally formed. If formed, the backside blocking dielectric layer 66 can be deposited on the physically exposed surfaces of the backside recesses 43, the backside contact trench 79, and on the topmost layer of the exemplary structure (such as the second contact level dielectric layer 73. The backside blocking dielectric layer 66 comprises a dielectric material that functions as a control gate dielectric for the control gates to be subsequently formed in the backside recesses 43. In case the at least one blocking dielectric layer (501, 503) is present within each memory opening, the backside blocking dielectric layer 66 is optional. In case the at least one blocking dielectric layer (501, 503) is omitted, the backside blocking dielectric layer 66 is present.

The backside blocking dielectric layer 66 comprises a dielectric material such as a dielectric metal oxide, silicon oxide, silicon nitride, a nitrogen-including organosilicate glass, or a combination thereof. In one embodiment, the dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The backside blocking dielectric layer 66 is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of a source region 61 (if formed prior to formation of the backside blocking dielectric layer 66). A backside cavity 79' is present within the portion of each backside via trench 79 that is not filled with the backside blocking dielectric layer 66. The backside blocking dielectric layer 66 is an optional structure, and may be omitted in some embodiments.

Figure 8B:
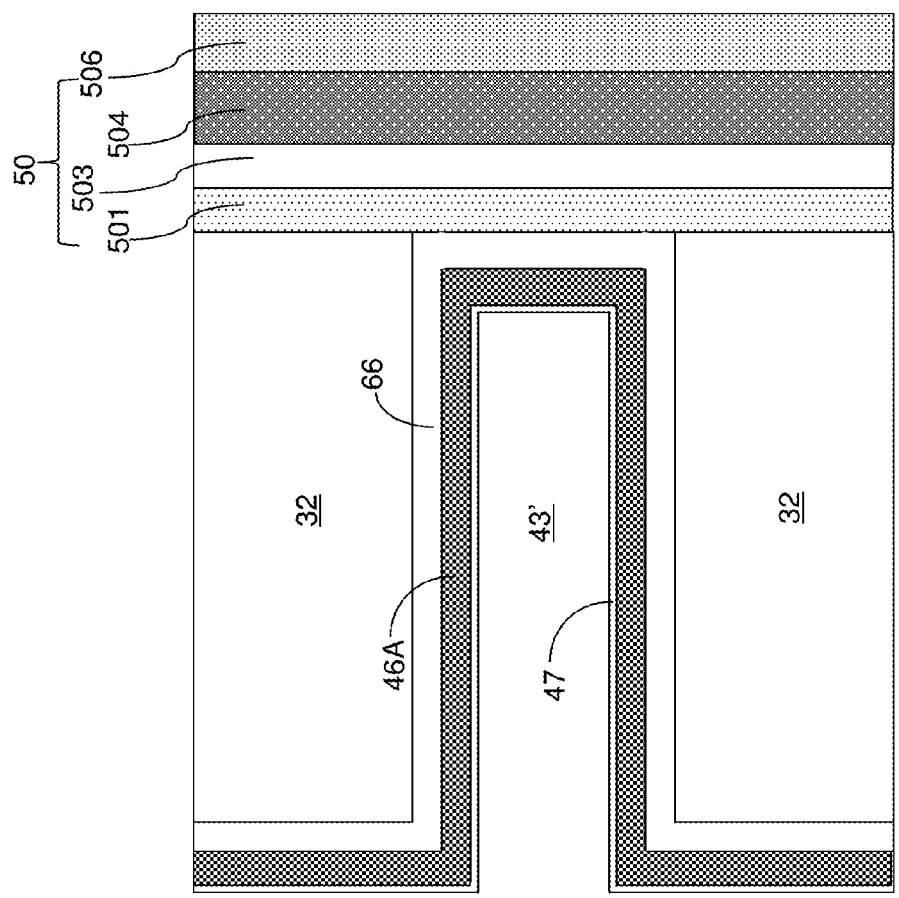
FIG. 8B is a vertical cross-sectional view of the backside recess region of the exemplary structure after formation of a boron adsorption layer according to an embodiment of the present disclosure.

Referring to FIG. 8B, a refractory metal nitride layer 46A can be deposited on the physically exposed surfaces of the backside blocking dielectric layer 66 (or on the physically exposed surfaces of the memory films 50 and the insulating layers 32 in case the backside blocking dielectric layer 66 is omitted). The refractory metal nitride layer 46A comprises a conductive nitride of at least one refractory metal. As used herein, a refractory metal refers to the group of metal elements selected from niobium, molybdenum, tantalum, tungsten, rhenium, titanium, vanadium, chromium, zirconium, hafnium, ruthenium, osmium and iridium. In one embodiment, the at least one refractory metal can comprise tungsten, titanium, and tantalum.

The refractory metal nitride layer 46A can be formed by a conformal deposition method such as atomic layer deposition or chemical vapor deposition. The thickness of the refractory metal nitride layer 46A can be in a range from 2 nm to 6 nm, although lesser and greater thicknesses can also be employed.

In one embodiment, the refractory metal nitride layer 46A can be deposited employing a fluorine-free metal nitride deposition process, i.e., a deposition process that deposits a fluorine-free metal nitride. As used herein, an element is fluorine free if the atomic concentration of fluorine in the elements is below trace level, i.e., below the level of atomic concentration of 0.01 p.p.m. In one embodiment, the deposition process can employ only fluorine-free materials for one or more reactants (precursor gases) and one or more additional optional agents (such as a nitridation agent). The nitridation agent can be a nitrogen-containing gas such as nitrogen, nitrous oxide, nitric oxide, and/or ammonia. The nitridation agent can be a fluorine-free gas.

In one embodiment, the fluorine-free metal nitride deposition process can be an atomic layer deposition process in which a fluorine-free metal precursor gas and a nitrogen-containing gas are alternately flowed into a process chamber in which the substrate is disposed. In one embodiment, the fluorine-free metal precursor gas can be selected from metal chloride precursor gases and organometallic precursor gases.

In one embodiment, the refractory metal nitride layer 46A can be a tungsten nitride layer. In this case, the fluorine-free metal nitride deposition process can be an atomic layer deposition process employing, as a fluorine-free metal precursor gas (i.e., a fluorine-free tungsten precursor gas), a gas selected from $WCl_6$, $W(CH_3)_6$, tungsten carbonyl, $WCl_2(Nt-Bu)_2py_2$, $W(Nt-Bu)_2Cl\{(Ni—Pr)_2CNi—Pr_2\}$, $W(Nt-Bu)_2Cl\{(Ni—Pr)_2CNMe_2\}$, $W(Nt-Bu)_2Cl\{(Ni—Pr)_2CNEt_2\}$, $W(Nt-Bu)_2Cl\{(NCy)_2CNEt_2\}$, $W(Nt-Bu)_2NMe_2\{(Ni—Pr)_2CNi—Pr_2\}$, $W(Nt-Bu)_2(NMe_2)\{(Ni—Pr)_2CNMe_2\}$, $W(Nt-Bu)_2(N_3)\{(Ni—Pr)_2CNi—Pr_2\}$, $W(Nt-Bu)_2\{(Ni—Pr)_2CNMe_2\}$, $[W(Nt-Bu)_2Cl\{NC(NMe_2)_2\}]_2$, $W(Nt-Bu)_2(N_3)\{NC(NMe_2)_2\}_2$, and $[(W(Nt-Bu)_2(N_3)(\mu_2-N_3)py)]_2$.

In one embodiment, the refractory metal nitride layer 46A can be a titanium nitride layer or a tantalum nitride layer. In one embodiment, the fluorine free metal nitride deposition process can employ a fluorine-free metal precursor gas including titanium or tantalum to deposit a fluorine-free titanium nitride layer or a fluorine-free tantalum nitride layer.

Alternatively, a fluorine-containing precursor gas can be employed to deposit the refractory metal nitride layer 46A. In this case, the refractory metal nitride layer 46A includes fluorine atoms at a residual atomic concentration level, which can be in a range from 0.1 p.p.m. to 0.1%.

In one embodiment, upon formation of the refractory metal nitride layer 46A, an optional boron adsorption layer 47 can be formed on the physically exposed surfaces of the refractory metal nitride layer 46A. The boron adsorption layer 46A includes a monolayer or a sub-monolayer of boron atoms and/or boron hydride radicals (such as —$BH_3$). In one embodiment, the boron adsorption layer 47 can be formed by treatment of physically exposed surfaces of the refractory metal nitride layer 46A with diborane ($B_2H_6$). For example, the boron adsorption layer 47 can be formed by placing the exemplary structure in a vacuum chamber, pumping down the vacuum chamber to a base pressure, and backfilling the vacuum with diborane gas to adsorb the molecules of the diborane gas to surfaces of the refractory metal nitride layer 46A. The adsorption process is self-saturating, and results in a monolayer or a sub-monolayer of boron atoms and/or boron hydride radicals, thereby forming the boron adsorption layer 47 on the physically exposed surfaces of the refractory metal nitride layer 46A.

In one embodiment, the last processing step of the fluorine-free metal nitride deposition process can fill a process chamber (which is a vacuum chamber) containing the substrate (9, 10) with a nitrogen-containing gas that adds nitrogen atoms to the refractory metal nitride layer 46A. In this case, the treatment of physically exposed surfaces of the refractory metal nitride layer 46A with diborane can immediately follow the last processing step of the fluorine-free metal nitride deposition process.

Figure 8C:
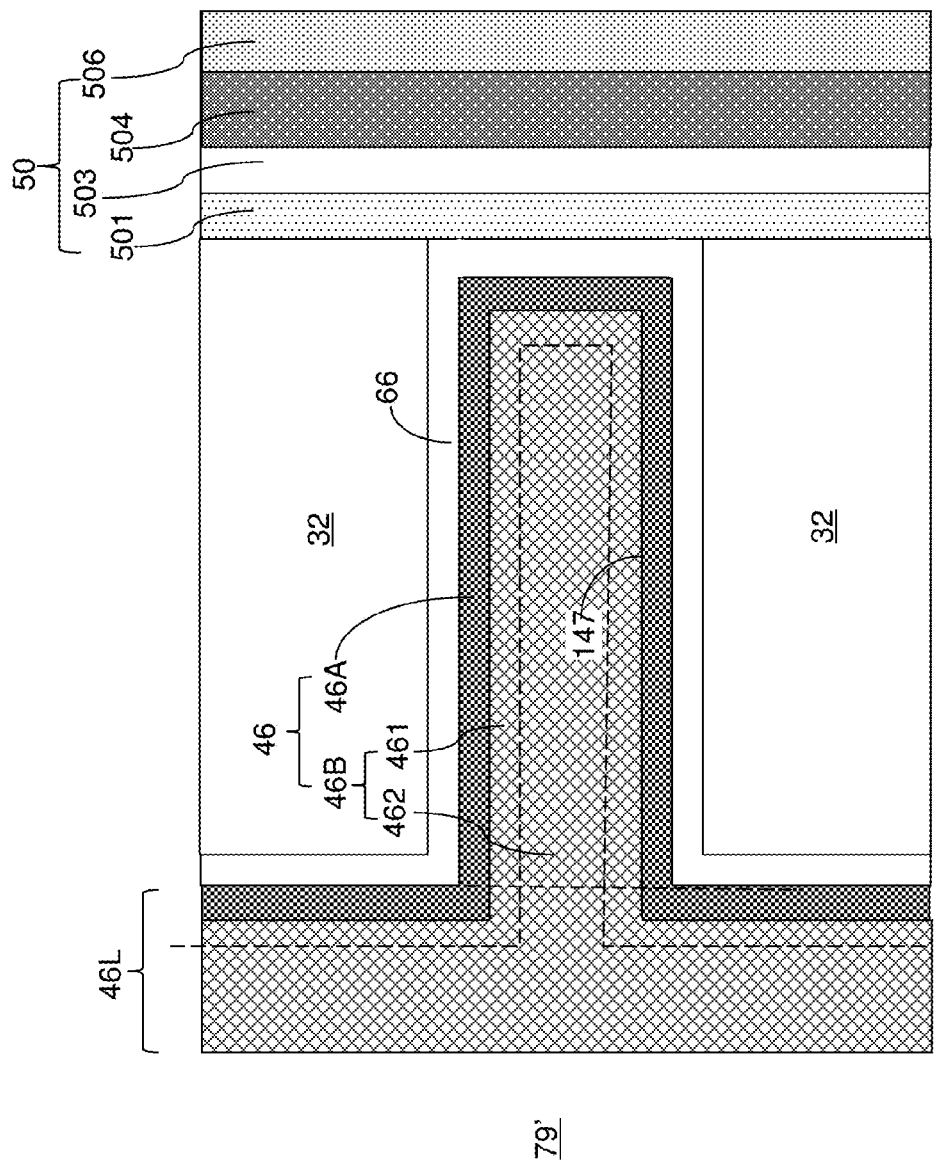
FIG. 8C is a vertical cross-sectional view of the backside recess region of the exemplary structure after formation of a tungsten layer according to an embodiment of the present disclosure.
Figure 9:
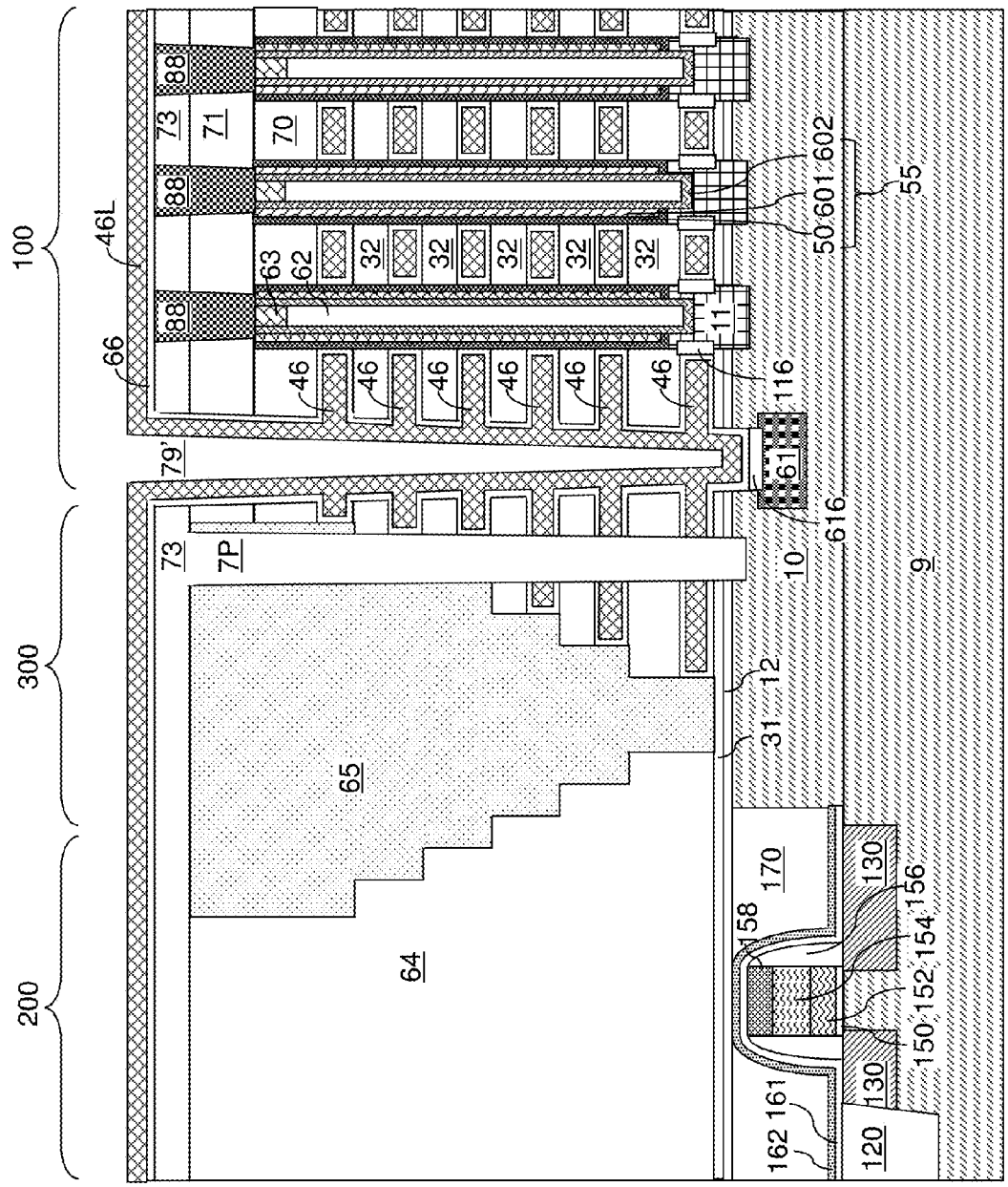
FIG. 9 is a vertical cross-sectional view of the exemplary structure after formation of the tungsten layer according to an embodiment of the present disclosure.

Referring to FIGS. 8C and 9, a tungsten layer 46B can be deposited directly on the boron adsorption layer 47 (or on the refractory metal nitride layer 46A if layer 47 is omitted). The tungsten layer 46B can be formed employing at least one fluorine-free tungsten deposition process, i.e., at least one deposition process that deposits fluorine-free tungsten. In one embodiment, the deposition process can employ only fluorine-free materials for one or more reactants (precursor gases) and one or more additional optional agents (such as a reduction agent). The reduction agent can be a hydrogen-containing gas such as hydrogen, silane, diborane, or a combination thereof. The reduction agent can be a fluorine-free gas.

In one embodiment, the fluorine-free tungsten deposition process can be a chemical vapor deposition process or an atomic layer deposition process in which a fluorine-free tungsten precursor gas and a reduction agent gas are concurrently or alternately flowed into a process chamber in which the substrate is disposed. In one embodiment, the at least one fluorine-free tungsten deposition process comprises an atomic layer deposition process in which a fluorine-free tungsten precursor gas and a reduction gas are alternately flowed into a process chamber in which the substrate is disposed. In another embodiment, the at least one fluorine-free tungsten deposition process comprises a chemical vapor deposition process in which a fluorine-free tungsten precursor gas and a reduction gas are simultaneously flowed into a process chamber in which the substrate is disposed.

In one embodiment, the fluorine-free tungsten precursor gas can be selected from tungsten chloride precursor gases and organometallic precursor gases including a tungsten atom. For example, the fluorine-free tungsten deposition process can be an atomic layer deposition process or a chemical vapor deposition process employing, as a fluorine-free metal precursor gas (i.e., a fluorine-free tungsten precursor gas), a gas selected from $WCl_6$, $W(CH_3)_6$, tungsten carbonyl, $WCl_2(Nt-Bu)_2py_2$, $W(Nt-Bu)_2Cl\{(Ni—Pr)_2CNi—Pr_2\}$, $W(Nt-Bu)_2Cl\{(Ni—Pr)_2CNMe_2\}$, $W(Nt-Bu)_2Cl\{(Ni—Pr)_2CNEt_2\}$, $W(Nt-Bu)_2Cl\{(NCy)_2CNEt_2\}$, $W(Nt-Bu)_2NMe_2\{(Ni—Pr)_2CNi—Pr_2\}$, $W(Nt-Bu)_2(NMe_2)\{(Ni—Pr)_2CNMe_2\}$, $W(Nt-Bu)_2(N_3)\{(Ni—Pr)_2CNi—Pr_2\}$, $W(Nt-Bu)_2\{(Ni—Pr)_2CNMe_2\}$, $[W(Nt-Bu)_2Cl\{NC(NMe_2)_2\}]_2$, $W(Nt-Bu)_2(N_3)\{NC(NMe_2)_2\}_2$, and $[(W(Nt-Bu)_2(N_3)(\mu_2-N_3)py)]_2$.

In one embodiment, the at least one fluorine-free tungsten deposition process can comprise a first tungsten deposition process employing a fluorine-free tungsten precursor gas and a first reduction gas that deposits a first tungsten sub-layer 461, and a second tungsten deposition process that deposits a second tungsten-sub-layer 462 on the first tungsten sub-layer 461. The first tungsten sub-layer 461 can incorporate at least a subset of the boron atoms of the boron adsorption layer 47. The presence of the boron adsorption layer 47 facilitates deposition of the first tungsten sub-layer 461 by reducing the fluorine-free tungsten precursor gas.

In one embodiment, the last processing step of the fluorine-free metal nitride deposition process can fill a process chamber (which is a vacuum chamber) containing the substrate (9, 10) with a nitrogen-containing gas that adds nitrogen atoms to the refractory metal nitride layer 46A, and the treatment of physically exposed surfaces of the refractory metal nitride layer 46A with diborane to form the boron adsorption layer 47 can immediately follow the last processing step of the fluorine-free metal nitride deposition process. The first processing step of the at least one fluorine-free tungsten deposition process can immediately follow formation of the boron adsorption layer 47. In one embodiment, the first processing step of the at least one fluorine-free tungsten deposition process can fill the process chamber containing the substrate (9, 10) with a tungsten-containing precursor gas. In one embodiment, the first processing step of the at least one fluorine-free tungsten deposition process can be the first processing step of the first tungsten deposition process. The second tungsten deposition process can employ either the same gases or at least one different gas than the first tungsten deposition process. For example, the second tungsten deposition process can employ a fluorine-free or fluorine containing tungsten precursor gas and a second reduction gas that is the same or different from the first reduction gas of the first tungsten deposition process. The fluorine-free tungsten precursor gas employed for the second tungsten deposition process can comprise one or more of the fluorine-free tungsten precursor gases that can be employed for the first tungsten deposition process. The fluorine-free tungsten precursor gas employed for the second tungsten deposition process can be the same as, or can be different from, the fluorine-free tungsten precursor gases employed for the first tungsten deposition process. In other words, the fluorine-free tungsten precursor gas employed for the second tungsten deposition process can be the same as the fluorine-free tungsten precursor gas employed for the first tungsten deposition process, or can be another tungsten-free precursor gas.

In one embodiment, the first tungsten deposition process can deposit the first tungsten sub-layer 461 as a nucleation (e.g., seed) layer having a thickness in a range from 0.5 nm to 5 nm, and the second tungsten deposition process can deposit the second tungsten sub-layer 462 as a fill layer to fill remaining volumes of the backside recesses 43. In one embodiment, the first reduction gas of the first tungsten deposition process that deposits the first tungsten sub-layer 461 can be selected from diborane and silane, and the second reduction gas of the second tungsten deposition process can be hydrogen. The inventors have found that for the first layer metal (i.e., seed or nucleation layer), tungsten deposited by fluorine free processes has a 10-50 times lower resistivity than tungsten deposited by conventional (F based) processes. The resistivity of this film is the same as that deposited by $WF_6$ and $H_2$ process (which is used in the prior art for the bulk fill, i.e., the second tungsten sub-layer 462). Thus, in addition to eliminating fluorine and its detrimental effects on creating stress on the substrate and voids in insulating layers, the methods of the present disclosure also minimize resistivity of the metal lines. In other words, the resistivity of the first tungsten sub-layer 461 as a fluorine free structure can be about the same as the resistivity of the second tungsten sub-layer 462 that is formed in a fluorine containing deposition process using $WF_6$ and $H_2$ source gases. In this case, the resistivity of the first tungsten sub-layer 461 can have a resistivity that is the same as, or substantially the same as, the resistivity of the second tungsten sub-layer 462. Alternatively, a ratio of the resistivity of the first tungsten sub-layer 461 can be greater than the resistivity of the second tungsten sub-layer 462, and can be greater than 1.0. In one embodiment, a resistivity of the first tungsten sub-layer 461 can be greater than the resistivity of the second tungsten sub-layer 462, and can be in a range from 1.0 to 3.0.

In an alternative embodiment, if the boron adsorption layer 47 is present then it can be used as the nucleation layer for the second tungsten sub-layer 462 and the first tungsten sub-layer can be omitted. The elimination of the higher resistivity, boron or silicon containing first tungsten sub-layer increases the available volume for the lower resistivity, boron and silicon free second tungsten sub-layer 462. Furthermore, by using a fluorine-free source gas for the tungsten layer, the thickness of the refractory metal nitride barrier layer 46A may be reduced to 1.5 to 3 nm, such as 2-3 nm (e.g., by more than 50% compared to prior art thickness). The elimination of sub-layer 461 and reduction of thickness of layer 46A may decrease the word line resistivity by up to 75% compared to word lines containing sub-layer 461 and a thicker (e.g., 5-10 nm TiN layer) layer 46A.

Furthermore, even if the first tungsten sub-layer 461 is present in the device, by using a fluorine-free precursor for its deposition reduces the resistivity and stress of the first tungsten sub-layer 461 compared to using a fluorine containing precursor by over 50% for sub-layer thickness of 5 nm or greater due to changes in the tungsten microstructure resulting from the absence of fluorine in the film. The stress reduction leads to a decrease in substrate warping of over 20%. Furthermore, using a fluorine-free precursor for the second tungsten sub-layer 462 leads to a lower tungsten thickness on the trench 79 sidewall and the top (field) area, which in turn also leads to less stress and substrate warping. High substrate warping makes it difficult to carry out the subsequent reactive ion etching step used to remove the excess W on the sidewalls because the wafer can no longer be properly clamped on the electrostatic chuck. Using a fluorine free process reduces the stress and therefore the warp and makes it possible to perform this step. Furthermore, having less tungsten on sidewall also makes it easier to remove it during the subsequent tungsten removal step (reduces the possibility of residual metal stringers that can short the word lines).

An electrically conductive layer 46 located between a neighboring pair of insulator layers 32 can fill a backside recess 46 between the neighboring pair of insulator layers 32 completely. Each electrically conductive layer 46 can be a portion of a contiguous electrically conductive material layer 46L that includes all electrically conductive layers 46 that fill the volumes of the backside recesses 46 and additionally includes portions of the refractory metal nitride layer 46A and the tungsten layer 46B in the backside contact trench 79 and over the topmost surface of the backside blocking dielectric layer 66.

In one embodiment, the entirety of the contiguous electrically conductive material layer 46L can be fluorine free. In this case, each electrically conductive layer 46 can be fluorine-free electrically conductive layers. In one embodiment, each fluorine-free electrically conductive layer can include a first fluorine-free tungsten layer as the first tungsten sub-layer 461, and a second fluorine-free tungsten layer as the second tungsten sub-layer 462.

The boron adsorption layer 47 can be wholly, or partly, incorporated into the contiguous electrically conductive material layer 46L, and the residue of the boron adsorption layer 47 can become an interfacial boron layer 147 that is present between the refractory metal nitride layer 46A and the tungsten layer 46B. In this case, the interfacial boron layer 147 can be located at the interface between the refractory metal nitride layer 46A and the tungsten layer 46B, and can have less than one monolayer of boron atoms (e.g., clusters of boron atoms and/or boron hydride residue).

In an embodiment, if the boron adsorption layer 47 is formed on the refractory metal nitride layer 46A, then a one step tungsten deposition process is used instead of the two-step tungsten deposition process that forms the first 461 and second 462 sub-layers. Use of a boron adsorption layer 47 can replace the first tungsten sub-layer 461. In other words, if a boron adsorption layer 47 is employed, then the tungsten layer 46B can be deposited in a single step by omitting the first tungsten sub-layer 461 and by forming the fluorine-free second tungsten sub-layer 462 directly on layer 47 as a seed or nucleation layer.

If, however, the boron adsorption layer 47 is not used, then both the first 461 and the second 462 sub-layers are preferably used. Thus, in another embodiment, the tungsten layer 46B can be formed by depositing a silicon-containing tungsten sub-layer as the first tungsten sub-layer 461 directly on the refractory metal nitride layer 46A, if a boron adsorption layer is not used, and subsequently depositing a silicon-free tungsten sub-layer as the second tungsten sub-layer 462 on the silicon-containing tungsten sub-layer. In this case, silane can be employed as the first reduction gas during deposition of the silicon-containing tungsten sub-layer, and hydrogen can be employed as the second reduction gas during deposition of the silicon-free tungsten sub-layer. The silicon-free tungsten sub-layer can be free of boron.

In one embodiment, one or more of the refractory metal nitride layer 46A, the first tungsten sub-layer 461, and the second tungsten sub-layer 462 can be formed employing a fluorine-containing metallic precursor, while at least one other the refractory metal nitride layer 46A, the first tungsten sub-layer 461, and the second tungsten sub-layer 462 can be formed employing a fluorine-free metallic precursor. In this case, the metallic material deposited employing a fluorine-containing precursor can have a fluorine concentration in a range from 0.1 p.p.m. to 0.1%. While presence of fluorine in any part of the contiguous electrically conductive material layer 46L is not desirable due to deleterious effects of the residual fluorine, the methods of the present disclosure may be employed in a less than optimal mode in which all layers within the contiguous electrically conductive material layer 46L are fluorine-free. For example, if the second tungsten sub-layer 462 is deposited using a fluorine containing precursor (e.g., tungsten hexafluoride with hydrogen reducing gas) to achieve a higher deposition rate, then the refractory metal nitride layer 46A and/or the first tungsten sub-layer 461 may comprise fluorine-free layers that act as fluorine barrier layers to block fluorine diffusion into the memory stack.

Figure 10:
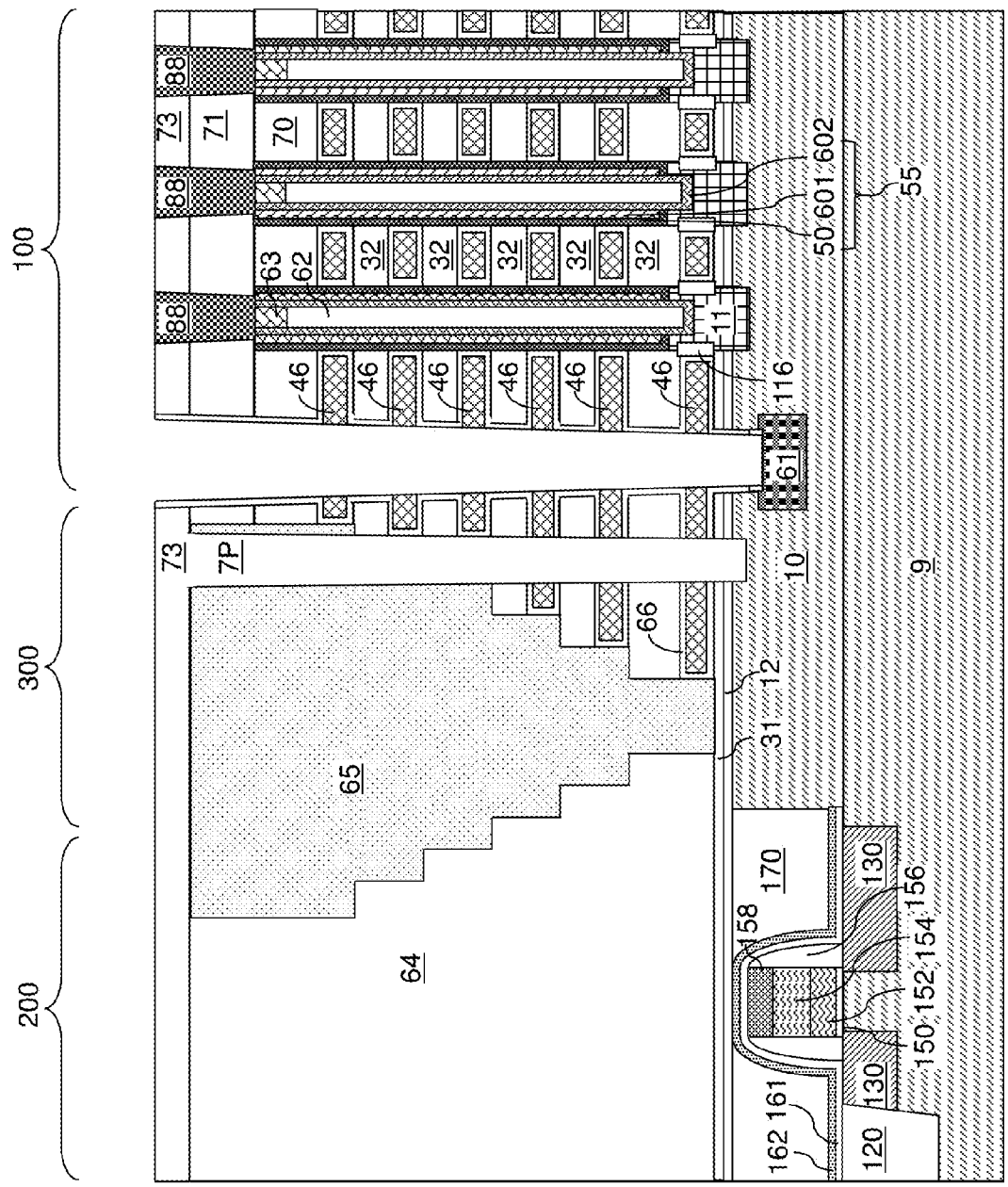
FIG. 10 is a vertical cross-sectional view of the exemplary structure after removal of deposited metallic materials from the backside contact trench according to an embodiment of the present disclosure.

Referring to FIG. 10, the deposited metallic materials of the contiguous electrically conductive material layer 46L is etched back from the sidewalls of each backside contact trench 79 and from above the second contact level dielectric layer 73 (or the dielectric material layer underlying the topmost horizontal portion of the contiguous electrically conductive material layer 46L in case the second contact level dielectric layer 73 is not present), for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 11:
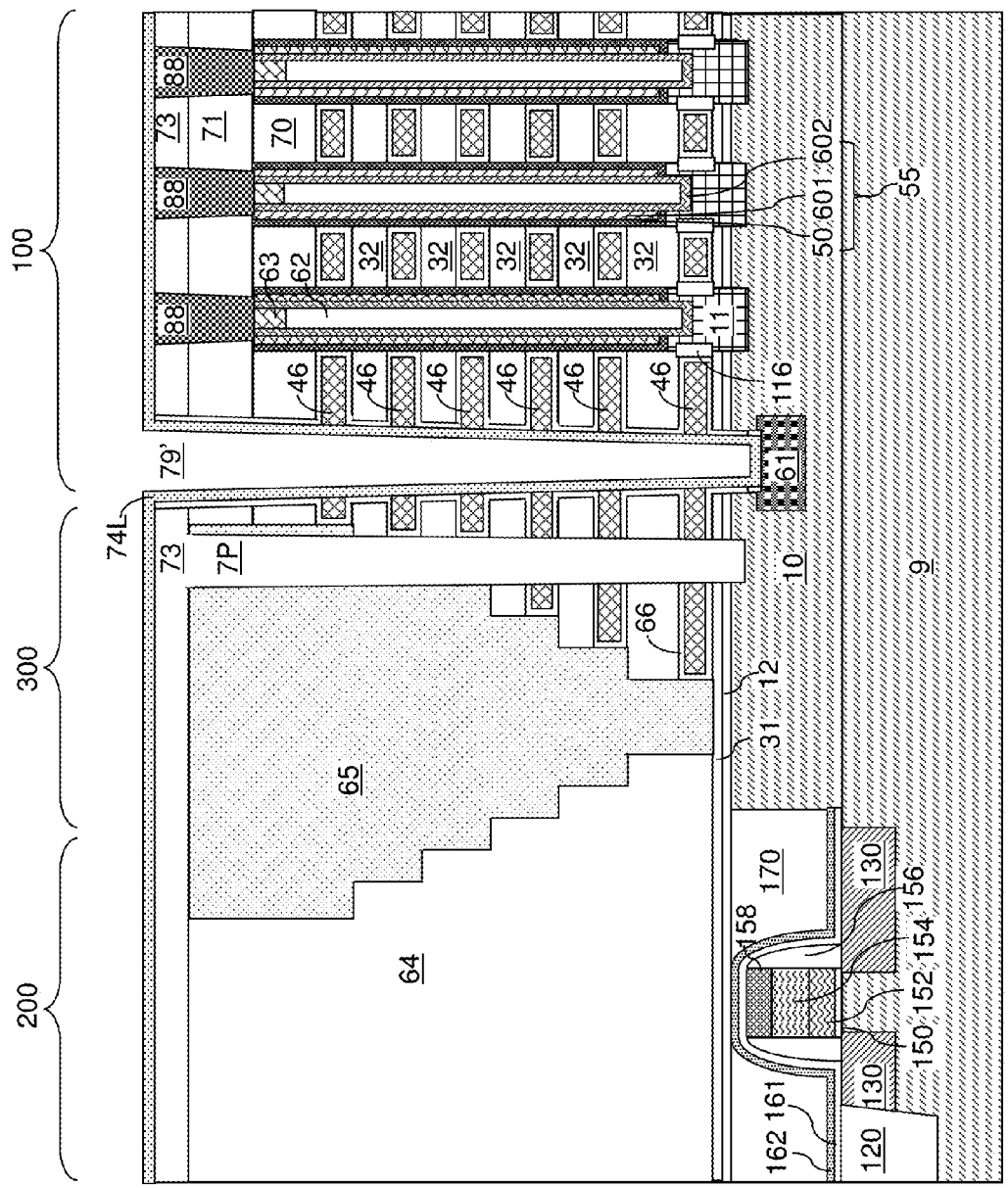
FIG. 11 is a vertical cross-sectional view of the exemplary structure after formation of an insulating spacer dielectric layer according to an embodiment of the present disclosure.

Referring to FIG. 11, an insulating material layer 74L can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer 74L includes an insulating material such as silicon oxide, silicon nitride, a dielectric metal oxide, an organosilicate glass, or a combination thereof. The thickness of the insulating material layer 74L can be in a range from 1.5 nm to 60 nm, although lesser and greater thicknesses can also be employed.

Figure 12:
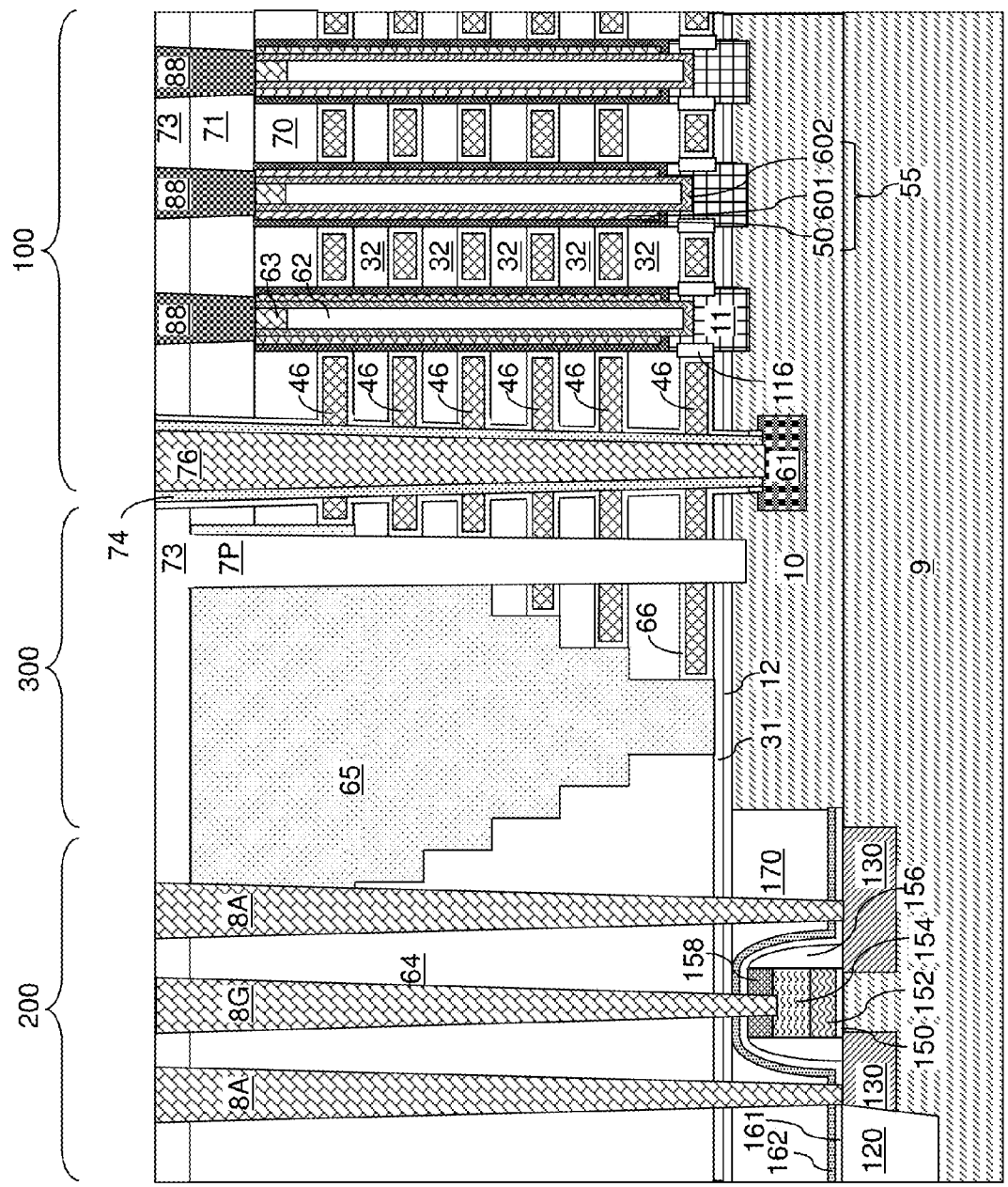
FIG. 12 is a vertical cross-sectional view of the exemplary structure after formation of a backside contact via structure according to an embodiment of the present disclosure.
Figure 13:
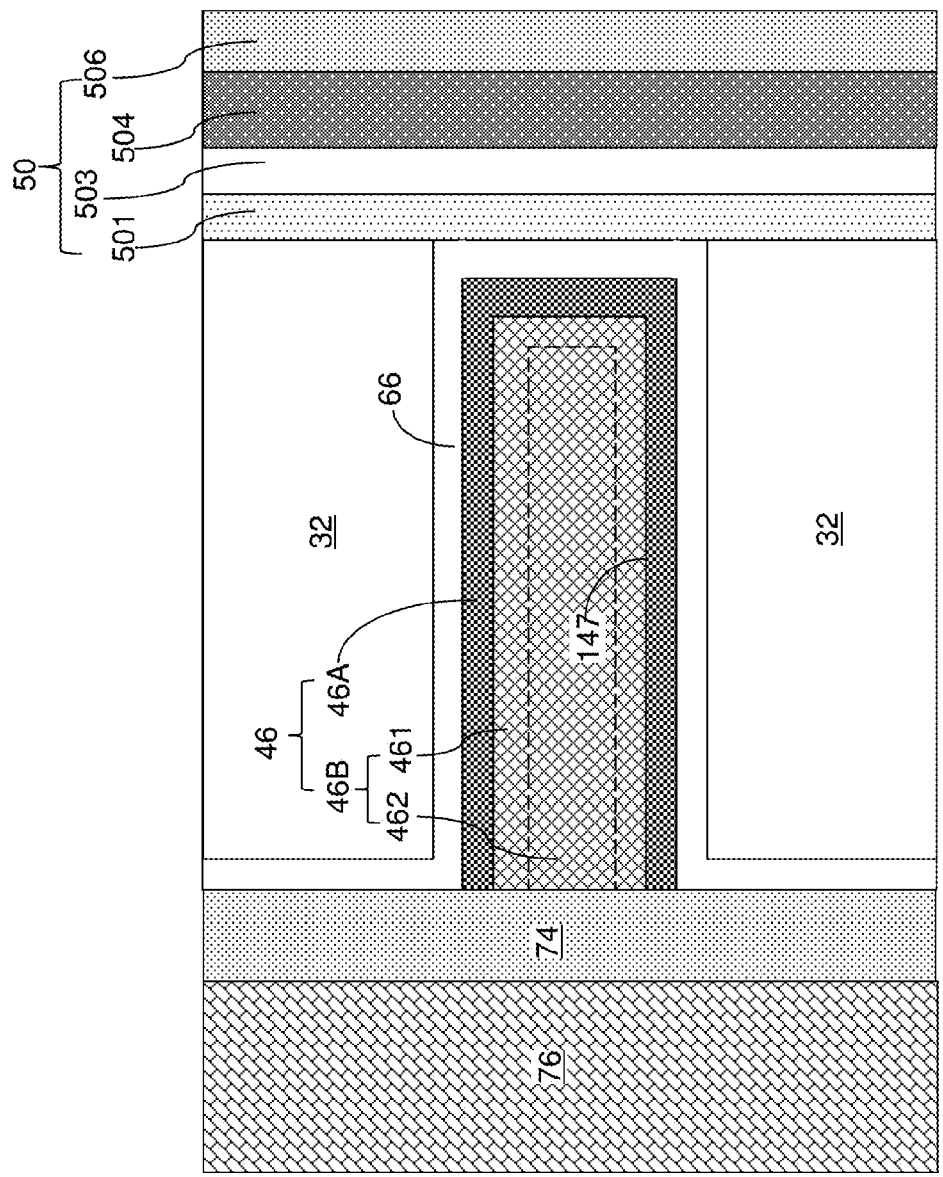
FIG. 13 is a magnified view of an electrically conductive layer of the exemplary structure of FIG. 12.

Referring to FIGS. 12 and 13, an anisotropic etch is performed to remove horizontal portions of the insulating material layer 74L and to optionally remove the horizontal portion of the backside blocking dielectric layer 66 from above the second contact level dielectric layer 73. Each remaining portion of the insulating material layer 74L inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on substantially vertical sidewalls of the backside blocking dielectric layer 66 and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm.

Various contact via structures can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A.

The exemplary structure includes a monolithic three-dimensional memory device. The monolithic three-dimensional memory device comprises a stack of alternating layers comprising insulating layers 32 and electrically conductive layers (44, 46) and located over a substrate (9, 10, 61), an array of memory openings extending through the stack; and a plurality of memory stack structures 55 located within a respective memory opening. Each electrically conductive layer 46 can laterally surround the plurality of memory stack structures 55.

In one embodiment, the memory device of the present disclosure can be a monolithic three-dimensional memory device comprising a vertical NAND device located over the substrate (9, 10, 61), and the electrically conductive layers (44, 46) can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate (9, 10, 61). In one embodiment, the plurality of semiconductor channels can comprise a common horizontal semiconductor channel portion that is a portion of the semiconductor material layer 10 between a source region 61 and the epitaxial channel portions 11, the epitaxial channel portions 11, and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

In one embodiment, the electrically conductive layers 46 can be fluorine-free electrically conductive layers. Each fluorine-free electrically conductive layer can comprises a portion of the refractory metal nitride layer 46A located between a vertically neighboring pair of insulator layers 32, and a portion of the tungsten layer 46B located between the vertically neighboring pair of insulator layers 32. In one embodiment, each fluorine-free electrically conductive layer can comprise boron atoms located at an interface between the refractory metal nitride layer 46A and the tungsten layer 46B.

In one embodiment, the at least one blocking dielectric layer (501, 503) and the backside blocking dielectric layer 66 can be provided. In this case, the at least one blocking dielectric layer (501, 503) is referred to as an inner blocking dielectric layer. In one embodiment, the inner blocking dielectric layer can comprises silicon oxide, and the backside blocking dielectric layer 66 can comprises a dielectric metal oxide such as aluminum oxide. In one embodiment, at least one layer within the inner blocking dielectric layer can comprise a silicon oxide layer.

Figure 14C:
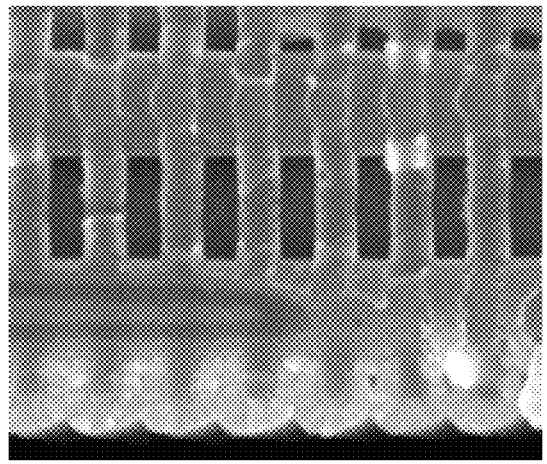
FIG. 14C is an electron microscope image of a device containing tungsten deposited by a fluorine-free process according to an exemplary embodiment of the present disclosure.
Figure 14B:
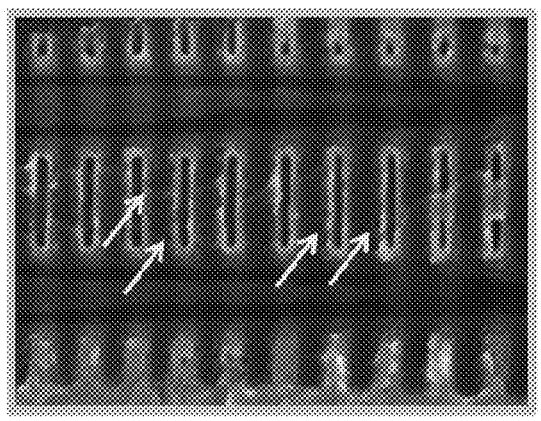
FIGS. 14A and 14B are electron microscope images of a device containing tungsten deposited by a fluorine containing process of comparative examples.
Figure 14A:
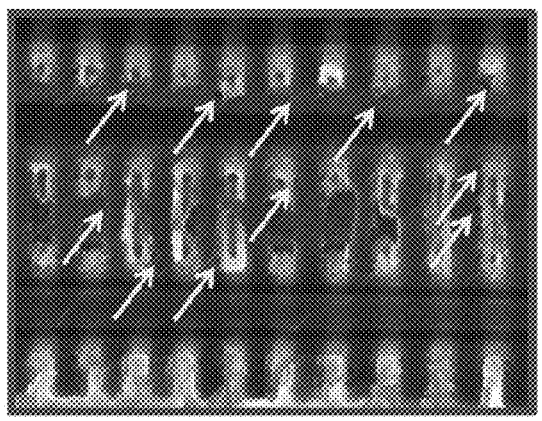

The present disclosure provides various methods for eliminating, or reducing, fluorine atoms from the electrically conductive layers employed as word lines in a three-dimensional memory device. Elimination, or reduction, of fluorine atoms from the electrically conductive layers can reduce, or eliminate, electrical shorts by erosion of materials (such as silicon oxide) that can be etched by residual fluorine atoms. FIGS. 14A and 14B are electron microscope images of devices containing tungsten deposited by the fluorine containing process of comparative examples at 300 and 395° C., respectively. As shown by the arrows in these figures, dozens of voids are created in the silicon oxide insulating layers and in the aluminum oxide blocking dielectric layer by the fluorine from the tungsten deposition process. FIG. 14C is an electron microscope image of a device containing tungsten deposited by a fluorine-free process according to an exemplary embodiment of the present disclosure. As shown in this figure, no voids are observed.

Furthermore, the fluorine-free word lines containing a thinner metal nitride barrier layer and/or omitting a boron or silicon and fluorine containing tungsten nucleation layer may also have a lower resistivity and a lower stress than fluorine containing word lines (e.g., word lines containing a thick TiN barrier layer and a boron or silicon containing tungsten nucleation layer). The lower stress decreases the amount of substrate warping caused by the deposition of the word lines over the substrate. Finally, the fluorine-free ALD deposition methods improve gap fill in the long and narrow recesses of the three dimensional devices described herein. Thus, the methods of the present disclosure can be employed to enhance the yield and/or reliability of three-dimensional memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a semiconductor device, comprising:
    forming a stack of alternating layers comprising insulating layers and sacrificial material layers over a substrate;
    forming a plurality of memory openings through the stack;
    forming memory stack structures in the plurality of memory openings, each of the memory stack structures comprising, from outside to inside, a memory material layer, a tunneling dielectric layer, and a semiconductor channel;
    forming a backside contact trench through the stack of alternating layers;
    forming backside recesses by removing the sacrificial material layers selective to the memory stack structures employing an etchant introduced through the backside contact trench;
    depositing a refractory metal nitride layer in the backside recesses;
    depositing a tungsten layer in remaining portions of the backside recesses, wherein at least one of the refractory metal nitride layer and the tungsten layer is formed employing a fluorine-free deposition process employing a fluorine-free metal precursor gas in an atomic layer deposition process; and
    removing portions of the refractory metal nitride layer and tungsten layer from inside the backside contact trench, wherein remaining portions of the tungsten layer and the refractory metal nitride layer constitute control gate electrodes for the memory stack structures.

2. The method of claim 1, wherein:
    the at least one of the refractory metal nitride layer is deposited employing the fluorine-free deposition process; and
    the fluorine-free metal nitride deposition process is an atomic layer deposition process in which the fluorine-free metal precursor gas and a nitrogen-containing gas are alternately flowed into a process chamber in which the substrate is disposed.

3. The method of claim 2, wherein the fluorine-free metal precursor gas is selected from metal chloride precursor gases and organometallic precursor gases.

4. The method of claim 3, wherein the refractory metal nitride layer is a tungsten nitride layer.

5. The method of claim 4, wherein the fluorine-free metal precursor gas is selected from $WCl_6$, $W(CH_3)_6$, tungsten carbonyl, $WCl_2(Nt\text{-}Bu)_2py_2$, $W(Nt\text{-}Bu)_2Cl\{(Ni\text{—}Pr)_2CNi\text{—}Pr_2\}$, $W(Nt\text{-}Bu)_2Cl\{(Ni\text{—}Pr)_2CNMe_2\}$, $W(Nt\text{-}Bu)_2Cl\{(Ni\text{—}Pr)_2CNEt_2\}$, $W(Nt\text{-}Bu)_2Cl\{(NCy)_2CNEt_2\}$, $W(Nt\text{-}Bu)_2NMe_2\{(Ni\text{—}Pr)_2CNi\text{—}Pr_2\}$, $W(Nt\text{-}Bu)_2(NMe_2)\{(Ni\text{—}Pr)_2CNMe_2\}$, $W(Nt\text{-}Bu)_2(N_3)\{(Ni\text{—}Pr)_2CNi\text{—}Pr_2\}$, $W(Nt\text{-}Bu)_2\{(Ni\text{—}Pr)_2CNMe_2\}$, $[W(Nt\text{-}Bu)_2Cl\{NC(NMe_2)_2\}]_2$, $W(Nt\text{-}Bu)_2(N_3)\{NC(NMe_2)_2\}_2$, and $[(W(Nt\text{-}Bu)_2(N_3)(\mu_2\text{-}N_3)py)]_2$.

6. The method of claim 1, further comprising forming a boron adsorption layer on surfaces of the refractory metal nitride layer by treatment of physically exposed surfaces of the refractory metal nitride layer with diborane ($B_2H_6$).

7. The method of claim 1, wherein the tungsten layer is deposited employing the fluorine-free tungsten deposition process.

8. The method of claim 7, wherein:
    a first processing step of the fluorine-free tungsten deposition process fills the process chamber containing the substrate with a tungsten-containing precursor gas; and the fluorine-free tungsten deposition process comprises at least one atomic layer tungsten deposition process employing a first fluorine-free tungsten precursor gas and a reduction gas which are alternately flowed into a process chamber in which the substrate is disposed.

9. The method of claim 8, wherein the refractory metal nitride layer is a tungsten nitride layer, and the first fluorine-free tungsten precursor gas is selected from $WCl_6$, $W(CH_3)_6$, tungsten carbonyl, $WCl_2(Nt\text{-}Bu)_2py_2$, $W(Nt\text{-}Bu)_2Cl\{(Ni\text{---}Pr)_2CNi\text{---}Pr_2\}$, $W(Nt\text{-}Bu)_2Cl\{(Ni\text{---}Pr)_2CNMe_2\}$, $W(Nt\text{-}Bu)_2Cl\{(Ni\text{---}Pr)_2CNEt_2\}$, $W(Nt\text{-}Bu)_2Cl\{(NCy)_2CNEt_2\}$, $W(Nt\text{-}Bu)_2NMe_2\{(Ni\text{---}Pr)_2CNi\text{---}Pr_2\}$, $W(Nt\text{-}Bu)_2(NMe_2)\{(Ni\text{---}Pr)_2CNMe_2\}$, $W(Nt\text{-}Bu)_2(N_3)\{(Ni\text{---}Pr)_2CNi\text{---}Pr_2\}$, $W(Nt\text{-}Bu)_2\{(Ni\text{---}Pr)_2CNMe_2\}$, $[W(Nt\text{-}Bu)_2\{NC(NMe_2)_2\}]_2$, $W(Nt\text{-}Bu)_2(N_3)\{NC(NMe_2)_2\}_2$, and $[(W(Nt\text{-}Bu)_2(N_3)(\mu_2\text{-}N_3)py)]_2$.

10. The method of claim 8, wherein the fluorine-free tungsten deposition process comprises:
a first tungsten deposition process employing the first fluorine-free tungsten precursor gas and a first reduction gas; and
a second tungsten deposition process employing a precursor gas selected from the first fluorine-free tungsten precursor gas or a different second tungsten-free precursor gas, and a second reduction gas that is different from the first reduction gas.

11. The method of claim 10, wherein the first reduction gas is selected from diborane and silane, and the second reduction gas is hydrogen.

12. The method of claim 11, wherein the refractory metal nitride layer is deposited employing the fluorine-free deposition process.

13. The method of claim 12, wherein each of the backside recesses is filled with a fluorine-free electrically conductive layer that comprises:
a portion of the refractory metal nitride layer located between a vertically neighboring pair of insulating layers; and
a portion of the tungsten layer located between the vertically neighboring pair of insulating layers.

14. The method of claim 13, further comprising boron atoms located at an interface between the refractory metal nitride layer and the tungsten layer.

15. The method of claim 1, wherein the tungsten layer is formed by:
depositing a silicon-containing tungsten sub-layer over the refractory metal nitride layer; and
depositing a silicon-free tungsten sub-layer on the silicon-containing tungsten sub-layer.

16. The method of claim 1, wherein the tungsten layer is formed by:
depositing a boron-containing tungsten sub-layer over the refractory metal nitride layer; and
depositing a boron-free tungsten sub-layer on the boron-containing tungsten sub-layer.

17. The method of claim 1, further comprising:
forming an inner blocking dielectric layer on sidewalls of the plurality of memory openings, wherein the memory material layer is deposited on the inner blocking dielectric layer; and
forming a backside blocking dielectric layer on physically exposed outer surfaces of the inner blocking dielectric layer and physically exposed surfaces of the insulator layers, wherein the refractory metal nitride layer is deposited on surfaces of the backside blocking dielectric layer.

18. The method of claim 17, wherein:
the inner blocking dielectric layer comprises silicon oxide; and
the backside blocking dielectric layer comprises aluminum oxide.

19. The method of claim 1, further comprising:
forming an insulating spacer on a sidewall of the backside contact trench after formation of the electrically conductive layers; and
forming a backside contact via structure within a portion of the backside contact trench that is not filled with the insulating spacer.

20. The method of claim 1, wherein:
the semiconductor device is a monolithic three-dimensional memory device comprising a vertical NAND device located over the substrate;
the electrically conductive layers comprise, or are electrically connected to, a respective word line of the vertical NAND device;
the substrate comprises a silicon substrate;
the vertical NAND device comprises an array of monolithic three-dimensional NAND strings located over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

21. A method of manufacturing a semiconductor device, comprising:
forming a stack of alternating layers comprising insulating layers and sacrificial material layers over a substrate;
forming a plurality of memory openings through the stack;
forming memory stack structures in the plurality of memory openings;
forming backside recesses by removing the sacrificial material layers around the memory stack structures;
depositing a refractory metal nitride layer in the backside recesses;
forming a boron adsorption layer on surfaces of the refractory metal nitride layer; and
depositing a tungsten layer on the boron adsorption layer.

22. The method of claim 21, wherein:
the refractory metal nitride layer is deposited employing a fluorine-free metal nitride deposition process;
the boron adsorption layer is formed by treatment of physically exposed surfaces of the refractory metal nitride layer with diborane ($B_2H_6$).

23. The method of claim 22, wherein a last processing step of the fluorine-free metal nitride deposition process fills a process chamber containing the substrate with a nitrogen-containing gas that adds nitrogen atoms to the refractory metal nitride layer, and the treatment of physically exposed surfaces of the refractory metal nitride layer with diborane immediately follows the last processing step of the fluorine-free metal nitride deposition process.

* * * * *